United States Patent [19]

Matsuzawa

[11] Patent Number: 5,748,132
[45] Date of Patent: May 5, 1998

[54] INTERPOLATION TYPE A/D CONVERTER

[75] Inventor: Akira Matsuzawa, Yawata, Japan

[73] Assignee: Matsushita Electric Industrial Co., Ltd., Kadoma, Japan

[21] Appl. No.: 679,796

[22] Filed: Jul. 15, 1996

[30] Foreign Application Priority Data

Jul. 17, 1995 [JP] Japan .................................. 7-179815

[51] Int. Cl.$^6$ .................................................. H03M 1/12
[52] U.S. Cl. ..................................................... 341/156
[58] Field of Search .................................. 341/161, 155, 341/159, 156, 150, 160

[56] References Cited

U.S. PATENT DOCUMENTS 5,151,700  9/1992  Matsuzawa et al. ...................... 341/156
5,321,402  6/1994  Matsuzawa et al. ...................... 341/161

*Primary Examiner*—Brian K. Young
*Attorney, Agent, or Firm*—Renner, Otto, Boisselle & Sklar, P.L.L.

[57] ABSTRACT

According to the present invention, an A/D converter for receiving an input voltage and outputting a digital signal representing a level of the input voltage by a number n (where n is a natural number equal to or larger than 2) of upper bits and a number m (where m is a natural number equal to or larger than 2) of lower bits is provided. The A/D converter includes: a reference voltage generator for generating a plurality of reference voltages; an upper bit generator for generating the upper bits by comparing the input voltage with the plurality of reference voltages; a selector for selecting a first voltage equal to or higher than the input voltage and a second voltage equal to or lower than the input voltage from the plurality of reference voltages; a first differential amplifier for amplifying a difference between the first voltage and the input voltage and outputting an amplified voltage; a second differential amplifier for amplifying a difference between the second voltage and the input voltage and outputting an amplified voltage; a lower bit generator for generating the lower bits by using the output voltage of the first differential amplifier and the output voltage of the second differential amplifier; and a synthesis circuit for generating the digital signal by synthesizing the upper bits with the lower bits.

8 Claims, 23 Drawing Sheets

FIG. 2
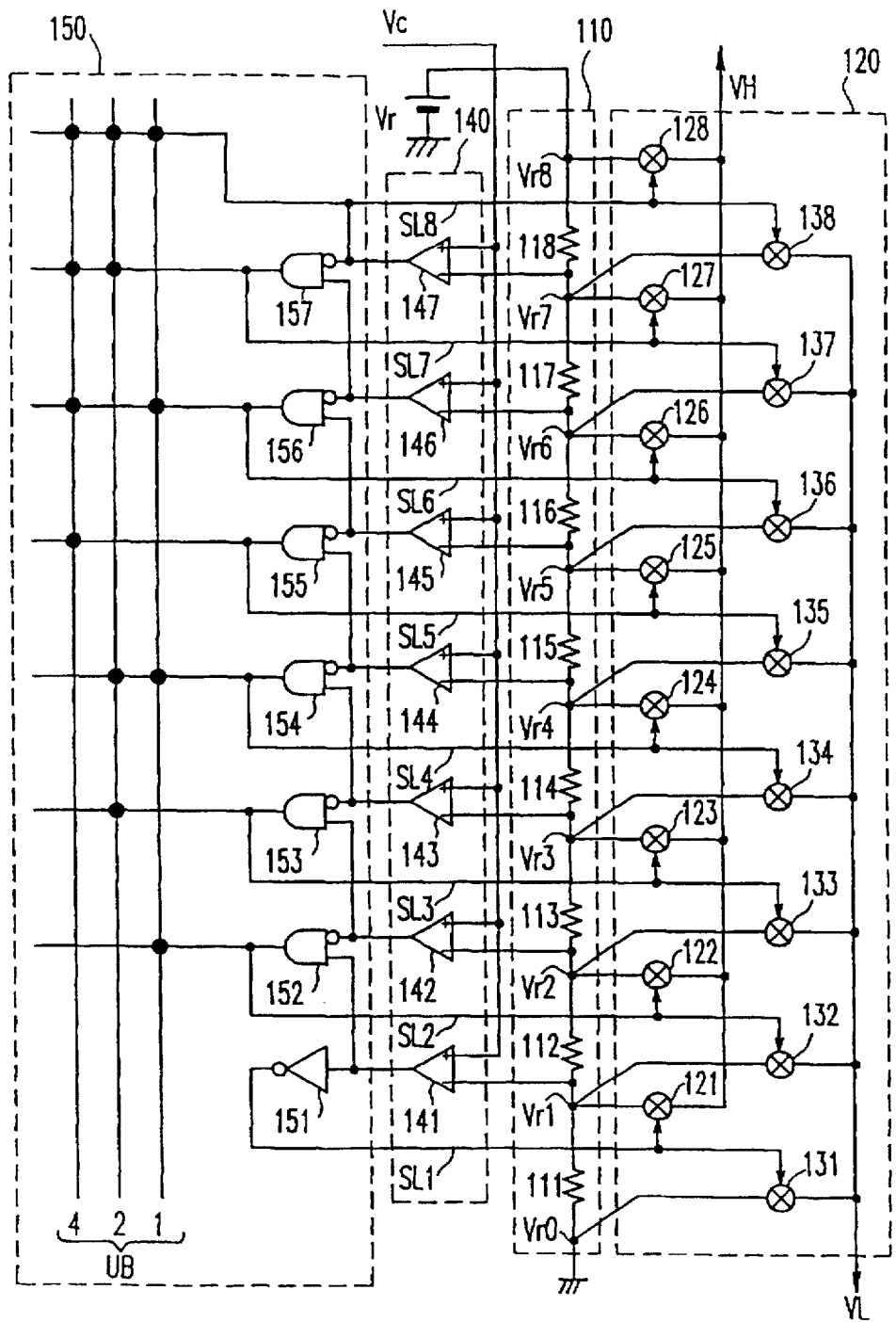
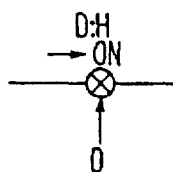

FIG.11
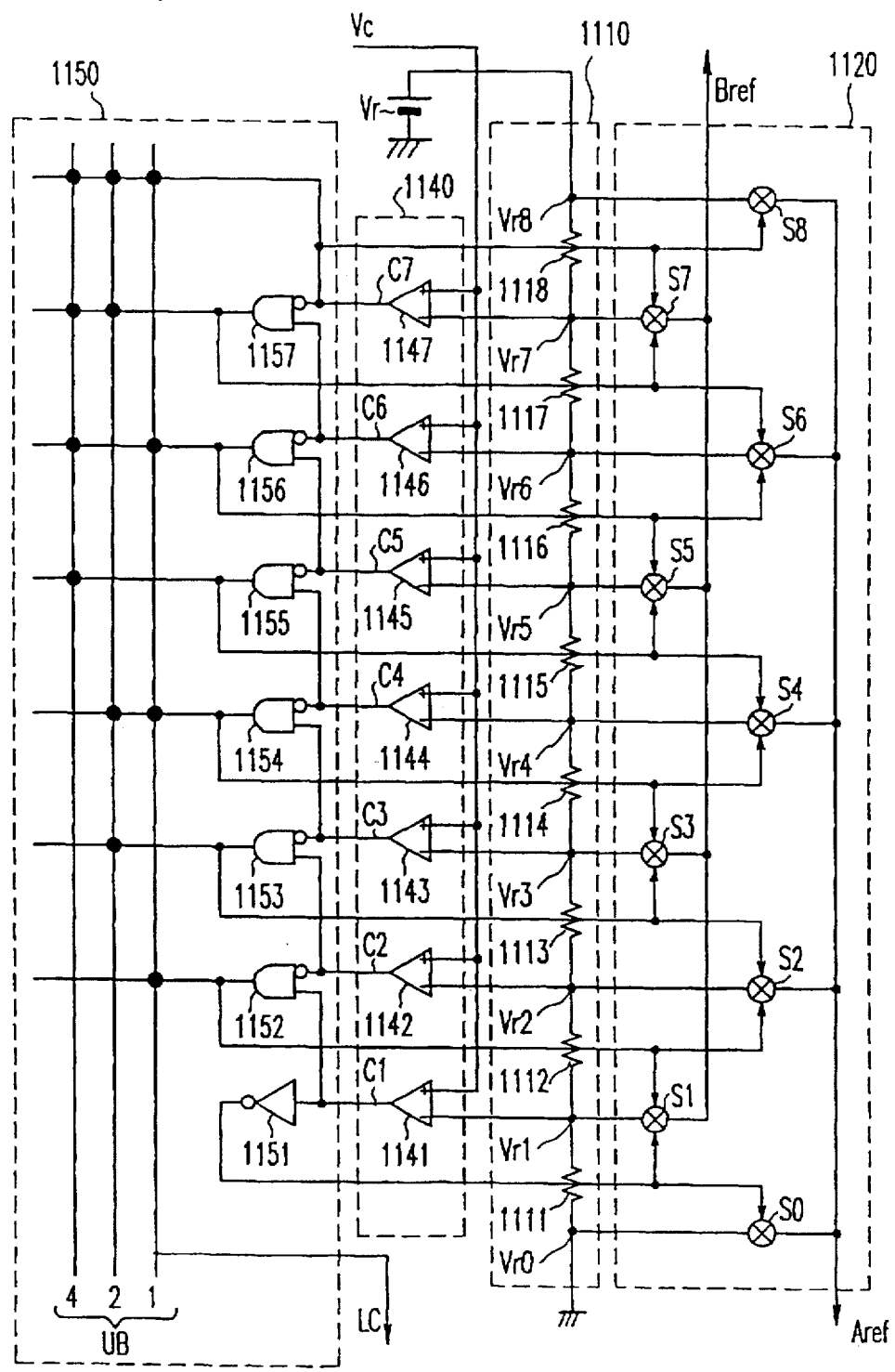
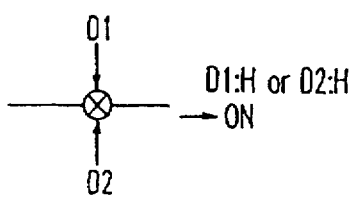

FIG.13

| Vc | Output of higher-order comparator array | Switches in on state | LC |
|---|---|---|---|
| Vr8 — | | | |
| | C7 | S7·S8 | 1 |
| Vr7 — | | | |
| | C6·$\overline{C7}$ | S7·S6 | 0 |
| Vr6 — | | | |
| | C5·$\overline{C6}$ | S5·S6 | 1 |
| Vr5 — | | | |
| | C4·$\overline{C5}$ | S5·S4 | 0 |
| Vr4 — | | | |
| | C3·$\overline{C4}$ | S3·S4 | 1 |
| Vr3 — | | | |
| | C2·$\overline{C3}$ | S3·S2 | 0 |
| Vr2 — | | | |
| | C1·$\overline{C2}$ | S1·S2 | 1 |
| Vr1 — | | | |
| | $\overline{C1}$ | S1·S0 | 0 |
| Vr0 — | | | |

(i)

(ii)

INTERPOLATION TYPE A/D CONVERTER

BACKGROUND OF THE INVENTION

1. Field of the Invention

The present invention relates to an interpolation type A/D converter. More specifically, the present invention relates to an improved serial-parallel type A/D converter.

2. Description of the Related Art

FIG. 23 is a circuit diagram showing a configuration for a serial-parallel type A/D converter described in U.S. Pat. No. 5,151,700. The A/D converter shown in FIG. 23 is a serial-parallel type A/D converter including: a reference voltage source 2301; a reference voltage generator 2302 for generating a plurality of reference voltages by dividing the reference voltage by using voltage dividers such as resistances and the like; a differential converter array 2304 consisting of a plurality of differential converters, each of which has two input terminals (i.e., a first input terminal, to which a common analog input signal 2303 is supplied, and a second input terminal, to which one of the reference voltages corresponding to the input terminal is supplied) and converts a potential difference between the two input terminals into a differential output voltage; a higher-order comparator array 2305 consisting of a plurality of comparators, each of which directly or indirectly compares the analog input signal 2303 with the reference voltage corresponding thereto; a higher-order logical circuit 2306 for subjecting the output signals of the higher-order comparator array 2305 to logical processing, thereby generating higher-order A/D converted outputs; a selector 2307 for selecting the differential output voltage of a differential converter, in which the reference voltage supplied thereto is close to the input voltage, from the plurality of differential converters included in the differential converter array 2304 in accordance with the output signals of the higher-order comparator array 2305 and transmitting the selected differential output voltage to the next stage; a first voltage divider 2308 for dividing the potential between the non-inverted output voltages of a pair of differential converters having two successive numbers when the differential converters included in the differential converter array 2304 are numbered in accordance with the levels of the reference voltages supplied thereto; a second voltage divider 2309 for dividing the potential between the inverted output voltages of a pair of differential converters having two successive numbers in a similar manner; a lower-order comparator array 2311 for directly or indirectly comparing a plurality of divided voltages generated by the first voltage divider 2308 and a plurality of divided voltages generated by the second voltage divider 2309 with each other; and a lower-order logical circuit 2310 for subjecting the outputs of the lower-order comparator array 2311 to logical processing, thereby generating lower-order converted values. Such an A/D converter can perform a high-precision A/D conversion without using adjustment circuits. In addition, since it is not necessary to use high-precision operational amplifiers, the A/D converter can advantageously perform an A/D conversion at a higher rate.

However, an A/D converter having the above-described configuration is provided beforehand with a plurality of differential converters each of which has two input terminals (i.e., a first input terminal, to which a common analog input signal 2303 is supplied, and a second input terminal, to which one of the reference voltages corresponding to the input terminal is supplied); selectively transmits the output signal of one of the plurality of differential converters to the next stage only when the reference voltage supplied to the differential converter is close to the input signal based on the results of the higher-order A/D conversion; divides a potential between the non-inverted output voltages of the transmitted output signal and a potential between the inverted output voltages of the transmitted output signal; and then performs a lower-order A/D conversion by comparing the divided signals with each other. Thus, assuming that the resolution of the higher-order A/D conversion is represented as N bits, a required minimum number of differential converters becomes $2^N$, so that the chip area and power consumption are disadvantageously increased.

SUMMARY OF THE INVENTION

The A/D converter of the invention receives an input voltage and outputs a digital signal representing a level of the input voltage by a number n (where n is a natural number equal to or larger than 2) of upper bits and a number m (where m is a natural number equal to or larger than 2) of lower bits. The A/D converter includes: reference voltage generation means for generating a plurality of reference voltages; upper bit generation means for generating the upper bits by comparing the input voltage with the plurality of reference voltages; selection means for selecting a first voltage equal to or higher than the input voltage and a second voltage equal to or lower than the input voltage from the plurality of reference voltages; first differential amplification means for amplifying a difference between the first voltage and the input voltage and outputting an amplified voltage; second differential amplification means for amplifying a difference between the second voltage and the input voltage and outputting an amplified voltage; lower bit generation means for generating the lower bits by using the output voltage of the first differential amplification means and the output voltage of the second differential amplification means; and synthesis means for generating the digital signal by synthesizing the upper bits with the lower bits.

In one embodiment, the lower bit generation means includes: voltage division means for outputting a plurality of divided voltages by dividing the output voltage of the first differential amplification means and the output voltage of the second differential amplification means; and a plurality of comparison means for comparing the plurality of divided voltages with a constant voltage.

In another embodiment, each of the first and the second differential amplification means outputs the amplified positive voltage as a non-inverted output and the amplified negative voltage as an inverted output, and the lower bit generation means includes: first voltage division means for outputting a plurality of divided voltages by dividing the voltage output as the non-inverted output by the first differential amplification means and the voltage output as the non-inverted output by the second differential amplification means; second voltage division means for outputting a plurality of divided voltages by dividing the voltage output as the inverted output by the first differential amplification means and the voltage output as the inverted output by the second differential amplification means; and comparison means for comparing the voltages output from the first voltage division means with the voltages output from the second voltage division means.

In still another embodiment, the first voltage division means divides a voltage VAO output as the non-inverted output by the first differential amplification means and a voltage VAk output as the non-inverted output by the second differential amplification means, thereby outputting voltages VA0, VA1, VA2, ... VAi, ... and VAk (where k is a natural number equal to or larger than 2; i is a natural number in a range from 1 to k; and VA0<VA1<VA2< ... <VAi< ... <VAk); the second voltage division means divides a voltage VB0 output as the inverted output by the first differential amplification means and a voltage VBk output as the inverted output by the second differential amplification means, thereby outputting voltages VB0, VB1, VB2, ... VBi, ... and VBk (where VB0<VB1<VB2< ... <VBi< ... <VBk); and the comparison means compares the voltages VAi and VBi (where i is a natural number equal to or smaller than k) with each other and compares the voltage VAi with a voltage VBi−1.

In still another embodiment, the reference voltage generation means generates a number k (where k is a natural number equal to or smaller than 2) of voltages V1, V2, ... Vi, ... and Vk (where i is a natural number in a range from 1 to k; and V1<V2< ... <Vi< ... <Vk); and, when the input voltage is in a range from a voltage Vi−1 to a voltage Vi+1, the selection means selects a voltage Vi+2 as the first voltage and selects a voltage Vi−2 as the second voltage.

In still another embodiment, when the input voltage is in a range from a voltage Vi−1 to a voltage Vi+1, the lower bit generation means performs an A/D conversion In a range from Vi−2 or the second voltage to Vi+2 or the first voltage by using (m+1) bits and outputs lower-order overflow data representing whether the input voltage exists in a range from the voltage Vi−2 and to the voltage Vi or in a range from the voltage Vi to the voltage Vi+2, and the synthesis means adds the lower-order overflow data to a least significant bit of the upper bits.

In still another embodiment, the reference voltage generation means outputs voltages VR0, VR1, VR2, ... VRi, ... and VRk (where k is a natural number equal to or larger than 2; i is a natural number in a range from 1 to k; and VR0<VR1<VR2< ... <VRi< ... <VRk), and the selection means selects the reference voltage depending upon whether the natural number i is an odd number or an even number.

In still another embodiment, the A/D converter further includes: track and hold means for holding the input voltage; track and hold means for holding the upper bits; and track and hold means for holding the first and the second voltages, thereby performing an A/D conversion by a pipeline operation.

Hereinafter, the functions or the effects attained by the present invention will be described. The A/D converter according to the present invention is the same as a conventional A/D converter in that a plurality of differential converters, each of which has two input terminals (i.e., a first input terminal, to which a common analog input signal is supplied, and a second input terminal, to which one of the reference voltages corresponding to the input terminal is supplied), are also provided beforehand. However, according to the present invention, it is not the output signal of one of the plurality of differential converters which has a reference voltage close to the input signal that is transmitted to the next stage based on the results of the higher-order A/D conversion. The A/D converter of the invention includes: a selector for selecting a plurality of reference voltages which are close to an input voltage in accordance with the output signals of the higher-order comparator array; and a differential converter array consisting of a plurality of differential converters, each of which has two input terminals (i.e., a first input terminal, to which a common analog input signal is supplied, and a second input terminal, to which the selected reference voltages are supplied) and converts a potential difference between these input terminals into a differential output signal. Thus, assuming that the resolution of the higher-order A/D conversion is represented as N bits, a required minimum number of differential converters is not $2^N$ but 2, so that it is possible to considerably reduce the power consumption and the chip size. For example, when the resolution of the higher-order A/D conversion is represented as 5 bits, only 2 differential converters are necessary for the A/D converter of the invention, though at least 32 differential converters are necessary for a conventional A/D converter. Therefore, the power consumption and the area on the chip can be reduced to about one-sixteenth in this section.

Thus, the invention described herein makes possible the advantages of (1) providing an A/D converter which can perform a high-precision A/D conversion at a higher rate, and (2) providing an A/D converter which has a reduced chip area and can perform such a high-precision and high-rate A/D conversion with lower power consumption and with lower costs.

These and other advantages of the present invention will become apparent to those skilled in the art upon reading and understanding the following detailed description with reference to the accompanying figures.

BRIEF DESCRIPTION OF THE DRAWINGS

FIG. 2 is a circuit diagram showing more detailed configurations for the reference voltage generator 110, the reference voltage selector 120, the higher-order comparator array 140 and the higher-order logical circuit 150 of the A/D converter shown in FIG. 1.

FIG. 11 is a circuit diagram showing a configuration for an interpolation type A/D converter in a third example of the present invention and corresponding to the circuit section including the reference voltage generator 110, the reference voltage selector 120, the higher-order comparator array 140 and the higher-order logical circuit 150 which are shown in FIG. 2.

FIG. 13 is a table showing a correspondence among the input voltage Vc, the comparators at an H level, the switches in an ON state and the values of the control signal LC for the lower-order logical circuit.

DESCRIPTION OF THE PREFERRED EMBODIMENTS

Figure 1:
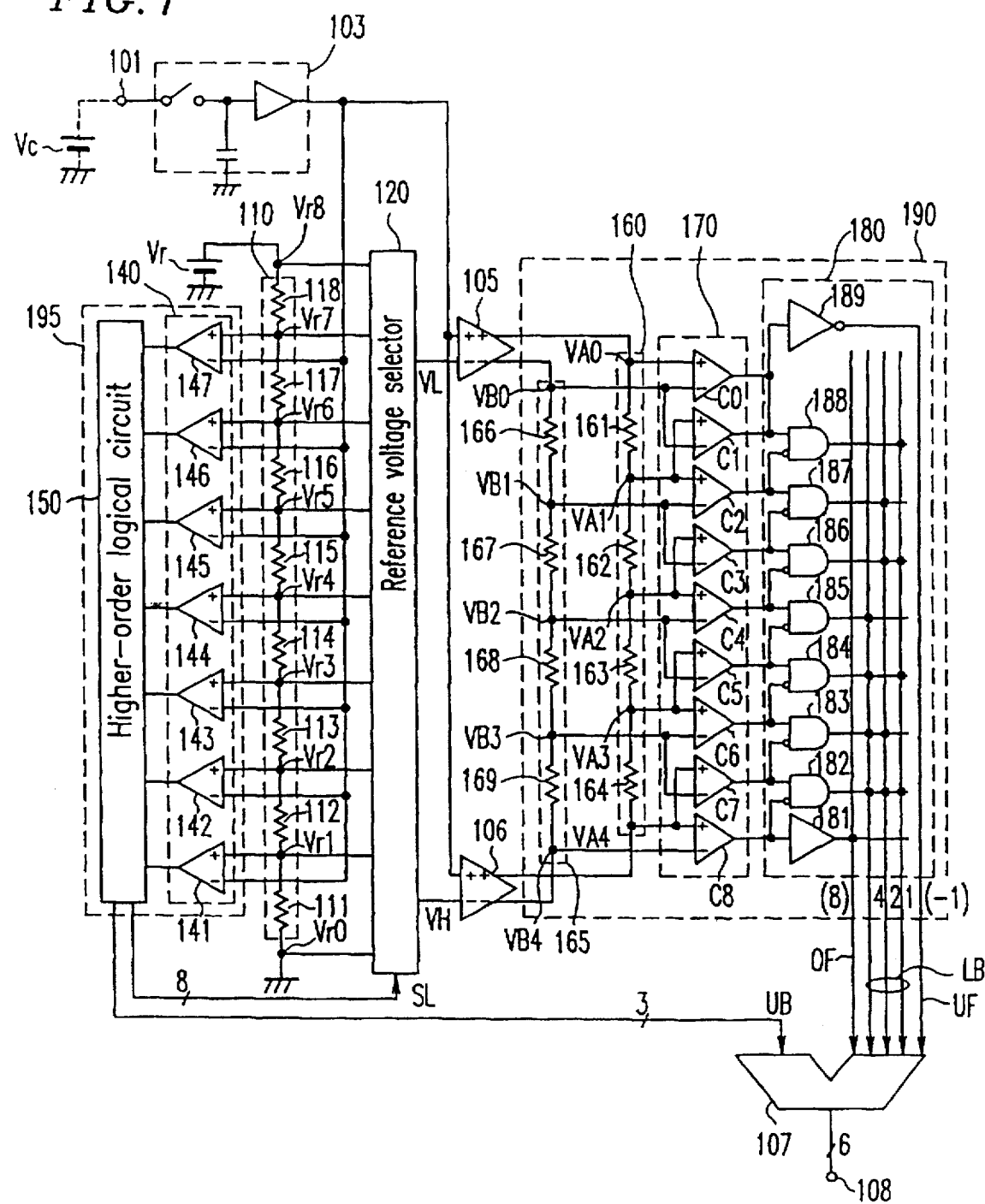
FIG. 1 is a circuit diagram showing a configuration for an interpolation type A/S converter in a first example of the present invention.

Hereinafter, the embodiments of the present invention will be described with reference to the accompanying drawings, in which the same reference numerals denote the same components throughout the following examples. In this specification, a reference numeral headed by "V" denotes not only a node but also the voltage of the node when a ground potential is regarded as a reference potential of the node. In addition, in this specification, a "potential of a node with respect to a ground" will be simply called a "node voltage" and "/" is used as a symbol indicating the inversion of the logical level (e.g., "/C1" indicates the inversion of a logical output C1).

EXAMPLE 1

FIG. 1 is a circuit diagram showing a configuration for an interpolation type A/D converter in a first example of the present invention. An input terminal 101 receives a voltage Vc to be A/D converted. The voltage Vc is applied between the input terminal 101 and the ground. In this example, the potential of the input terminal 101 is assumed to be higher than the ground potential. A sampling circuit 103 holds the input voltage Vc for a predetermined time. This circuit is required because the A/D converter of the invention performs the conversion of the upper bits and the lower bits at respectively different timings.

A reference voltage source 102 generates a constant voltage Vr. A terminal of the reference voltage source 102, which is different from the terminal connected to the ground, is connected to one terminal of a reference voltage generator 110. The potential of the reference voltage generator 110 at the terminal connected to the reference voltage source 102 is higher than the ground potential.

The reference voltage generator 110 includes serially connected resistances 111 to 118. One terminal of the resistance 111 is connected to the ground. One terminal of the resistance 118 is connected to the terminal of the reference voltage source 102 which is not connected to the ground. The resistances 111 to 118 have an equal resistance value (e.g., the combined resistance of the serially connected resistances 111 to 118 is on the order of 1 k$\Omega$). Therefore, a voltage at a node Vr1 between the resistances 111 and 112 (hereinafter, referred to as a "reference voltage Vr1") is equal to Vr/8. In the same way, reference voltages Vr2 to Vr8 are equal to 2Vr/8, 3Vr/8, ... and Vr, respectively. Since a reference voltage Vr0 is equal to the ground potential, Vr0 is 0 V.

The number of resistances which are serially connected in the reference voltage generator 110 and the respective resistance values are not limited to the above-described values. In other words, the reference voltage generator 110 may have 9 or more resistances or 7 or more resistances. Moreover, the resistance values of the resistances 111 to 118 are not always required to be equal to each other.

In accordance with a control voltage SL, a reference voltage selector 120 outputs reference voltages Vri and Vri+1, which satisfy an inequality Vri$\leq$Vc$\leq$Vri+1 (where "i" is an integer satisfying an inequality 0$\leq$i$\leq$7), as voltages VL and VH to differential amplifiers 105 and 106, respectively. Herein, i and (i+1) are successive integers. For example, when Vc satisfies an inequality Vr4$\leq$Vc$\leq$Vr5, the reference voltage selector 120 outputs the reference voltage Vr5 as a voltage VH to the differential amplifier 105 and outputs the reference voltage Vr4 as a voltage VL to the differential amplifier 106.

The differential amplifier 105 receives a voltage Vc at a non-inverted input terminal (or an input terminal to which a label "+" is attached) and a voltage VL at an inverted input terminal (or an input terminal to which a label "−" is attached), and outputs a voltage (A(Vc−VL)) (where A is an amplification factor) from a non-inverted output terminal (or an output terminal to which a label "+" is attached) and a voltage (−A(Vc−VL)) from an inverted output terminal (or an output terminal to which a label "−" is attached). In the same way, the differential amplifier 106 receives a voltage Vc at a non-inverted input terminal and a voltage VH at an inverted input terminal, and outputs a voltage (A(Vc−VH)) (where A is an amplification factor) from a non-inverted output terminal and a voltage (−A(Vc−VH)) from an inverted output terminal.

An upper bit generator 195 includes a higher-order comparator array 140 and a higher-order logical circuit 150.

The higher-order comparator array 140 includes comparators 141 to 147. The comparators 141 to 147 receive voltages Vr1 to Vr7 at the non-inverted input terminals thereof, respectively, and receives a voltage Vc at the inverted input terminals thereof. In this specification, all the "comparators" including the comparators 141 to 147 are assumed to output an "H" level when a voltage at a non-inverted input terminal (or an input terminal to which a label "+" is attached) is higher than a voltage at an inverted input terminal (or an input terminal to which a label "−" is attached) or output an "L" level when a voltage at a non-inverted input terminal is lower than a voltage at an inverted input terminal.

In accordance with the outputs of the comparators 141 to 147, the higher-order logical circuit 150 generates a control voltage SL and then outputs the voltage SL to the reference voltage selector 120. In addition, in accordance with the outputs of the comparators 141 to 147, the higher-order logical circuit 150 generates upper bits UB of a digital signal representing a level of the input voltage Vc and then outputs the upper bits UB to a synthetic logical circuit 107. In the embodiments of this specification, a voltage of an input analog signal is converted into a digital signal composed of 6 bits in total, i.e., 3 bits as the upper bits UB and 3 bits, as the lower bits LB. However, the bit number of a digital signal is not limited to 6. It is noted that the control voltage SL is formed by eight control lines as will be described later.

A lower bit generator 190 includes: a voltage divider 160; a voltage divider 165, a lower-order comparator array 170; and a lower-order logical circuit 180.

The voltage divider 160 Includes serially connected resistances 161 to 164. Voltages VA0 and VA4 are (A(Vc−VL)) and (A(Vc−VH)), respectively. The voltage divider 165 has serially connected resistances 166 to 169. Voltage VB0 and VS4 are (−A(Vc−VL)) and (−A(Vc−VH)), respectively. The resistances 161 to 164 and 166 and 169 have an equal resistance value (e.g., the combined resistance of the serially connected resistances 161 to 164 and the combined resistance of the serially connected resistances 166 to 169 are on the order of 1 kΩ).

As a result of the division of the voltages VA0 and VA4, the following voltages VA1 to VA3 are obtained:

$$VA1=3A(VH-VL)/4+A(Vc-VH)$$

$$VA2=2A(VH-VL)/4+A(Vc-VH)$$

$$VA3=1A(VH-VL)/4+A(Vc-VH)$$

In the same way, as a result of the division of the voltages VB0 and VB4, the following voltages VB1 to VB3 are obtained:

$$VB1=3A(VL-VH)/4-A(Vc-VH)$$

$$VB2=2A(VL-VH)/4-A(Vc-VH)$$

$$VB3=1A(VL-VH)/4-A(Vc-VH)$$

The lower-order comparator array 170 includes comparators C0 to C8. The comparator C0 compares the voltage VA0 with the voltage VB0; the comparator C2 compares the voltage VA1 with the voltage VB1; the comparator C4 compares the voltage VA2 with the voltage VB2; the comparator C6 compares the voltage VA3 with the voltage VB3, the comparator C8 compares the voltage VA4 with the voltage VB4; the comparator C1 compares the voltage VA1 with the voltage VB0; the comparator C3 compares the voltage VA2 with the voltage VB1; the comparator C5 compares the voltage VA3 with the voltage VB2; and the comparator C7 compares the voltage VA4 with the voltage VB3. The comparators C0 to C8 output an "H" level when a voltage at a non-inverted input terminal is higher than a voltage at an inverted input terminal or outputs an "L" level when a voltage at a non-inverted input terminal is lower than a voltage at an inverted input terminal.

In accordance with the outputs of the comparators C0 to C8, the lower-order logical circuit 180 generates lower bits LB of a digital signal representing a level of the input voltage Vc and then outputs the lower bits LB to the synthetic logical circuit 107. The lower-order logical circuit 180 includes gates 181 to 189. The outputs of the gates 181 to 189 are output as the lower bits LB to the synthetic logical circuit 107 via the coding dots of a read-only memory (ROM). The synthetic logical circuit 107 synthesizes the upper bits UB and the lower bits LB with each other, thereby outputting a 6 bit output signal representing the level of the input voltage from an output terminal 108.

FIG. 2 is a circuit diagram showing more detailed configurations for the reference voltage generator 110, the reference voltage selector 120, the higher-order comparator array 140 and the higher-order logical circuit 150.

The reference voltage selector 120 includes switches 121 to 128 and switches 131 to 138. Each of the switches 121 to 128 and 131 to 138 closes when a control terminal D thereof is at the "H" level and opens when the control terminal D thereof is at the "L" level.

The higher-order logical circuit 150 includes gates 151 to 157. The outputs of the gates 151 to 157 are output as the upper bits UB to the synthetic logical circuit 107 via the coding dots of a ROM.

Figure 3:
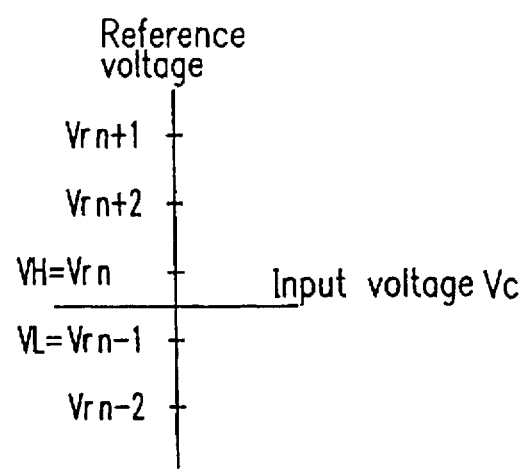
FIG. 3 shows a relationship between the input voltage Vc and the voltages VL and VH output from the reference voltage selector 120.

FIG. 3 shows a relationship between the input voltage Vc and the voltages VL, and VH output from the reference voltage selector 120. Each of the voltages Vrn−2, Vrn−1, Vrn, Vrn+1 and Vrn+2 on the vertical axis represents a voltage between adjacent nodes of the reference voltage generator 110. The horizontal line represents the voltage Vc input to the input terminal 101. When an inequality Vrn−1≦Vc≦Vrn (where n−1 and n are successive integers) is satisfied, the reference voltage selector 120 outputs Vrn as the voltage VH and Vrn−1 as the voltage VL.

Referring to FIG. 2 again, the operation of the reference voltage selector 120 will be described. For example, when an inequality Vr4<Vc<Vr5 is satisfied, the outputs of the comparators 141 to 144 are at the "H" level, while the outputs of the comparators 145 to 147 are at the "L" level. Therefore, only the output of the gate 155 is at the "H" level and the outputs of the other gates 151 to 154, 156 and 157 are at the "L" level, so that only the switches 125 and 135 are turned ON and the other switches 121 to 124, 126 to 128, 131 to 134 and 136 to 138 are turned OFF. As a result, the reference voltage selector 120 outputs Vr5 as the voltage VH and outputs Vr4 as the voltage VL.

Hereinafter, the operation of the higher-order logical circuit 150 will be described. If an inequality Vr4<Vc<Vr5 is satisfied again, only the output of the gate 155 is at the "H" level. Thus, the higher-order logical circuit 150 outputs "100" as the upper bits UB to the synthetic logical circuit 107 via the coding dots of a ROM.

Figure 4:
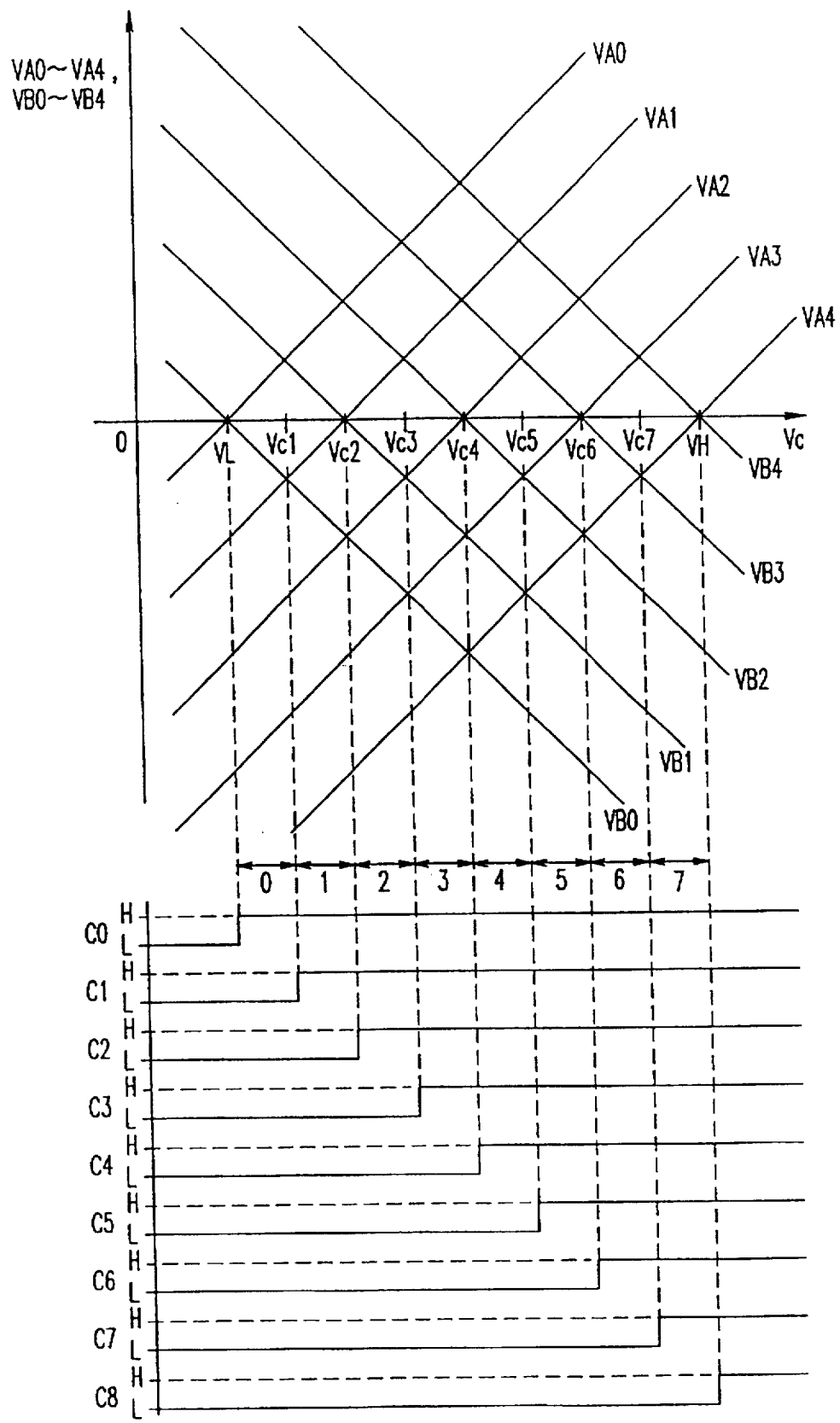
FIG. 4 is a graph showing a relationship between the input voltage Vc (on the axis of abscissas) and each of the voltages (on the axis of ordinates) at the nodes VA0 to VA4 of the voltage divider 160 and the nodes VB0 to VB4 of the voltage divider 166, and a relationship between the input voltage Vc (on the axis of abscissas) and each of the outputs (on the axis of ordinates) of the comparators C0 to C8.

FIG. 4 is a graph showing a relationship between the input voltage Vc (on the axis of abscissas) and each of the voltages (on the axis of ordinates) at the nodes VA0 to VA4 of the voltage divider 160 and the nodes VB0 to VB4 of the voltage divider 166, and a relationship between the input voltage Vc (on the axis of abscissas) and each of the outputs (on the axis of ordinates) of the comparators C0 to C8. Referring to FIGS. 1 and 4, the operation of the lower bit generator 190 will be described. A voltage level becomes higher from the voltage VL until the voltage VH via the voltages Vc1 to Vc7 in this order such that a potential difference between adjacent voltages is ((VH−VL)/8). For example, when an inequality Vc4<Vc<Vc5 is satisfied, the outputs of the comparators C0 to C4 are at the "H" level and the outputs of the comparators C5 to C8 are at the "L" level. Therefore, only the output of the gate 185 is at the "H" level, so that "100" is output as the lower bits LB via the coding dots of the ROM. In FIG. 1, the output UF indicates an underflow (or that the voltage Vc is lower than the voltage VL) and the output OF indicates an overflow (or that the voltage Vc is higher than the voltage VH).

In the A/D converter of the first example, the number of necessary differential amplifiers can be considerably reduced as compared with a conventional A/D converter. In general, a differential amplifier occupies a larger area on a chip and consumes a larger amount of power as compared with a comparator. For example, a differential amplifier consumes a power 10 times as large as that consumed by a comparator and occupies a chip area 10 times as large as that occupied by a comparator. Consequently, the A/D converter of the invention has advantages of considerably reducing the power consumption and the area occupied by the A/D converter on a chip.

In the first to the seventh examples, the amplification factor of the differential amplifiers 105 and 106 is preferably about 8. The reason will be briefly described below. Assuming that the input offset voltage of a comparator included in the lower-order comparator array 170 is denoted by Voff and the amplification factor of the differential amplifiers 105 and 106 is denoted by A, Voff becomes Voff/2A when it is converted on the input side of the differential amplifiers 105 and 106. This means that, the larger the amplification factor of the differential amplifiers 105 and 106 becomes, the less the A/D conversion precision is affected by the offset voltage of the second stage comparator. If it is assumed that the offset of the comparator corresponds to 6 bits and a precision of 10 bits is required in total, then the amplification factor $A=(2^{(10-6)}/2)=8$. Thus, a preferable amplification factor A turns out to be 8.

EXAMPLE 2

Figure 5:
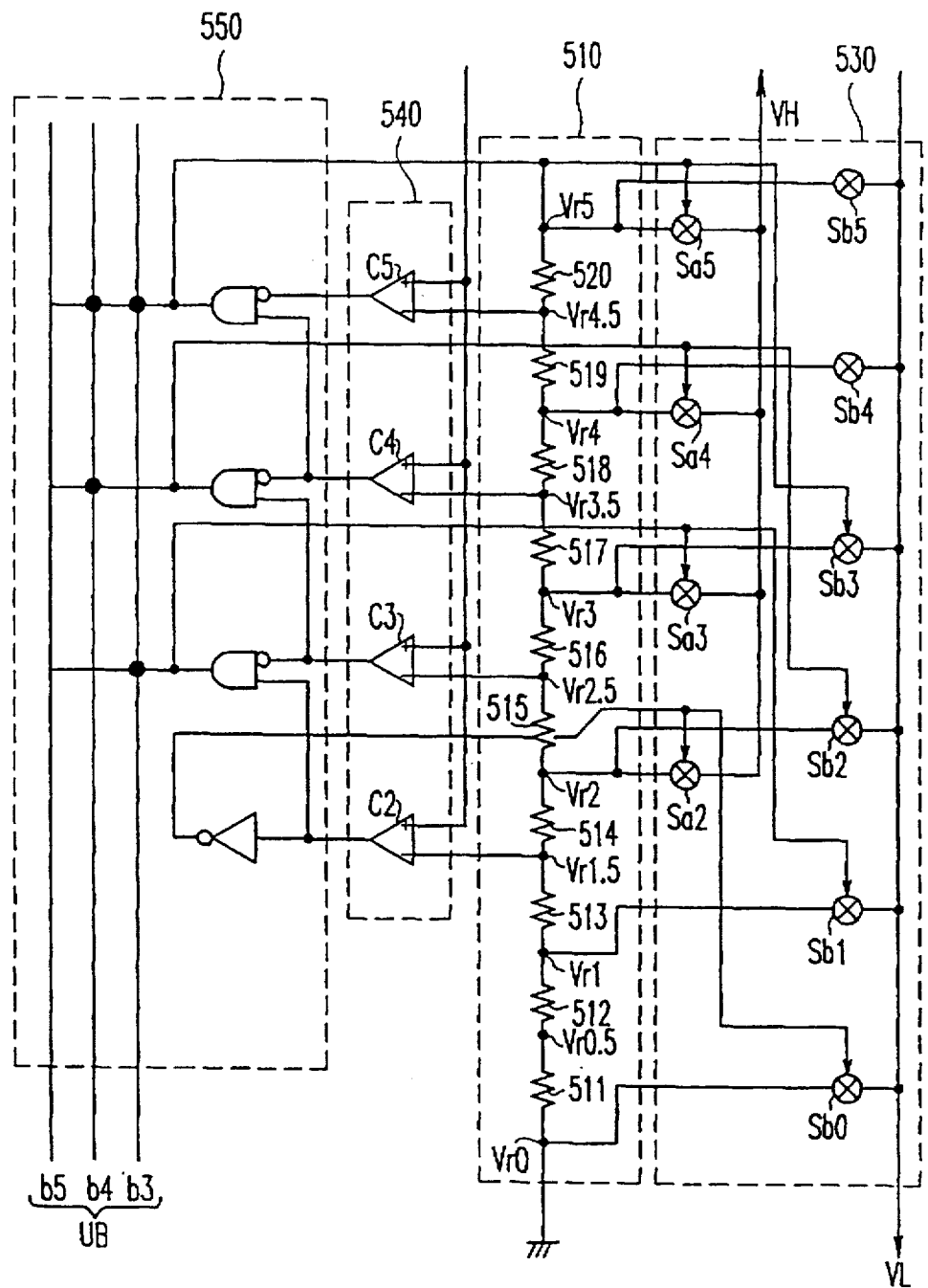
FIG. 5 is a circuit diagram showing a configuration for an interpolation type A/D converter in a second example of the present invention.

FIG. 5 is a circuit diagram showing a configuration for an interpolation type A/D converter in a second example of the present invention. Only the components which operate in a different manner from those of the first example will be described below, and the same operation as that of the first example will not be described herein. The circuit section shown in FIG. 5 corresponds to a lower circuit section including the nodes Vr5 to Vr0 shown in FIG. 2. Thus, in an A/D converter actually used, another circuit section having a similar configuration and corresponding to the circuit section including the nodes Vr6 to Vr8 shown in FIG. 2 is connected over the circuit section shown in FIG. 5. Moreover, in the second example, a circuit in which the number of resistances forming each of the voltage dividers 160 and 165 is increased to eight is used as a lower bit generator such that the lower bit output LB of the lower bit generator 190 shown in FIG. 1 becomes 4 bits. Therefore, the number of comparators included in the lower-order comparator array 170 becomes 17.

A reference voltage generator 510 includes resistances 511 to 520 having an equal resistance value. In the second example, a node Vrn+0.5 is further provided between the adjacent nodes Vrn and Vrn+1 of the first example. Herein, n and n+1 are successive integers. A reference voltage selector 530 includes switches Sa2 to Sa5 and Sb0 to Sb5. In the second example, when an Inequality Vrn−0.5<Vc<Vrn+0.5 is satisfied, a voltage Vn−1 is output as the voltage VL and a voltage Vn+1 is output as the voltage VH by performing the same operation as that of the first example. For example, when an inequality Vr1.5<Vc<Vr2.5 is satisfied, a voltage Vr1 is output as the voltage VL and a voltage Vr3 is output as the voltage VH.

A higher-order comparator array 540 includes comparators C2 to C5. The higher-order comparator array 540 compares the voltages Vr1.5, Vr2.5, Vr3.5, etc., with the input voltage Vc.

A higher-order logical circuit 550 operates in the same way as the higher-order logical circuit 150 of the first example. For example, when an inequality Vr1.5<Vc<Vr2.5 is satisfied, the higher-order logical circuit 550 outputs "001" as the upper bits.

Figure 6:
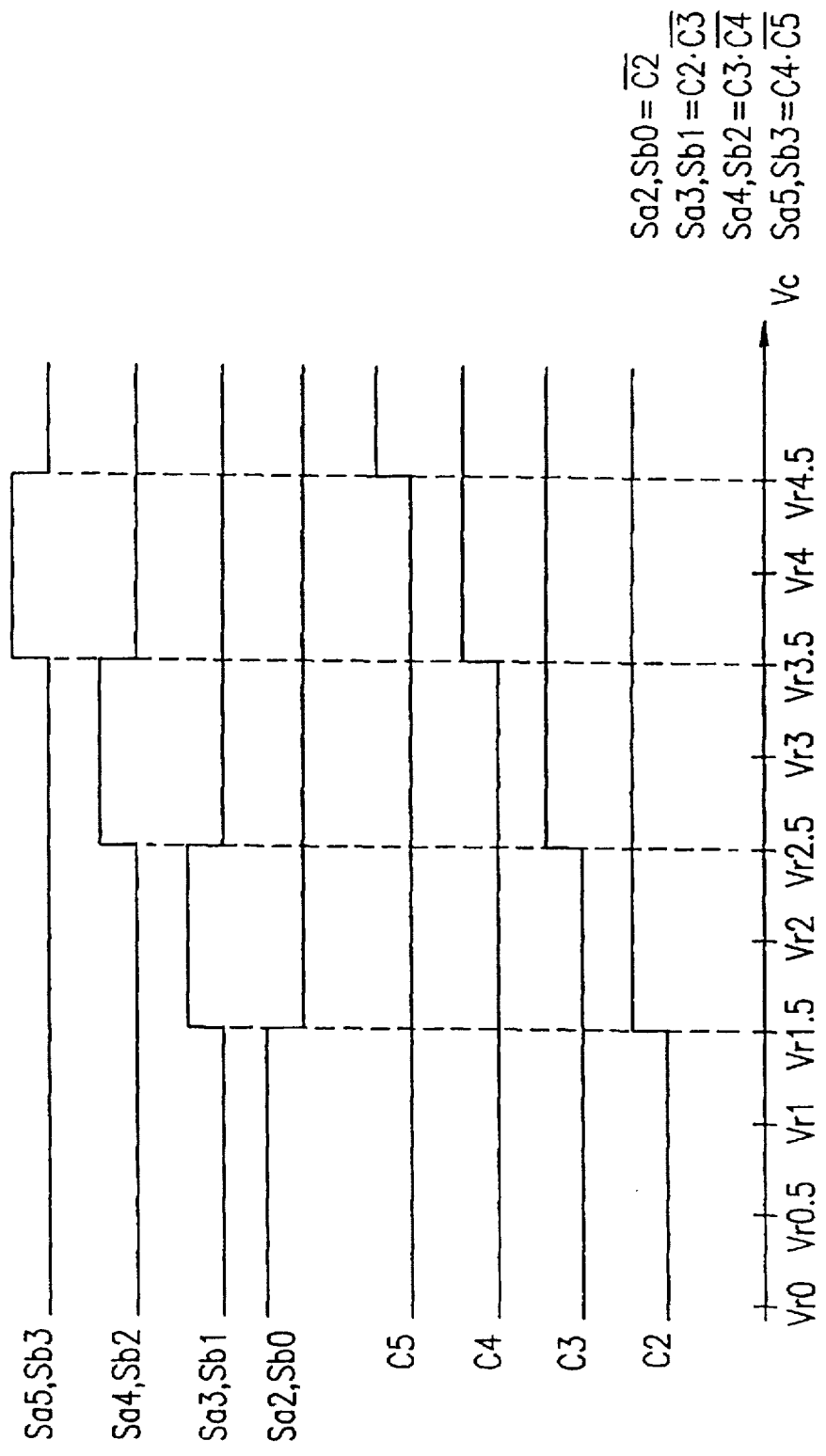
FIG. 6 shows a relationship between the voltage Vc and the states of the switches Sa2 to Sa5 and Sb0 to Sb5 of the circuit shown in FIG. 5 and a relationship between the voltage Vc and the outputs of the comparators C2 to C5.

FIG. 6 shows a relationship between the voltage Vc and the state of each of the switches Sa2 to Sa5 and Sb0 to Sb3 shown in FIG. 5 and a relationship between the voltage Vc and the output of each of the comparators C2 to C5. As shown in FIG. 6, the following relationships are satisfied:

$$Sa2=Sb0=/C2$$

$$Sa3=Sb1=C2\cdot/C3$$

$$Sa4=Sb2=C3\cdot/C4$$

and $$Sa5=Sb3=C4\cdot/C5.$$

Figure 7:
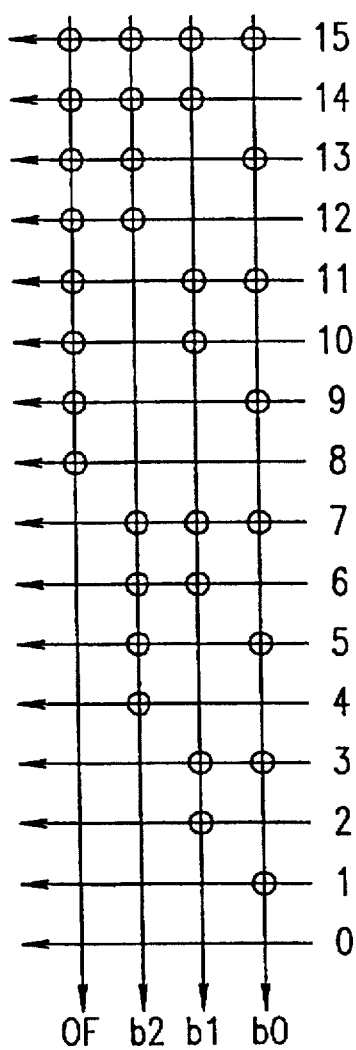
FIG. 7 shows the coding dots of the ROM in the second example.

FIG. 7 shows the coding dots of the ROM in the second example. The 16 lines having leftward arrows shown in FIG. 7 are connected to the corresponding gates 181 to 188 shown in FIG. 1. In order to obtain a final output, 4 bits (an output OF and the bits b2 to b0) are used as the lower bits and 3 bits (b5 to b3) are used as the upper bits.

Figure 8:
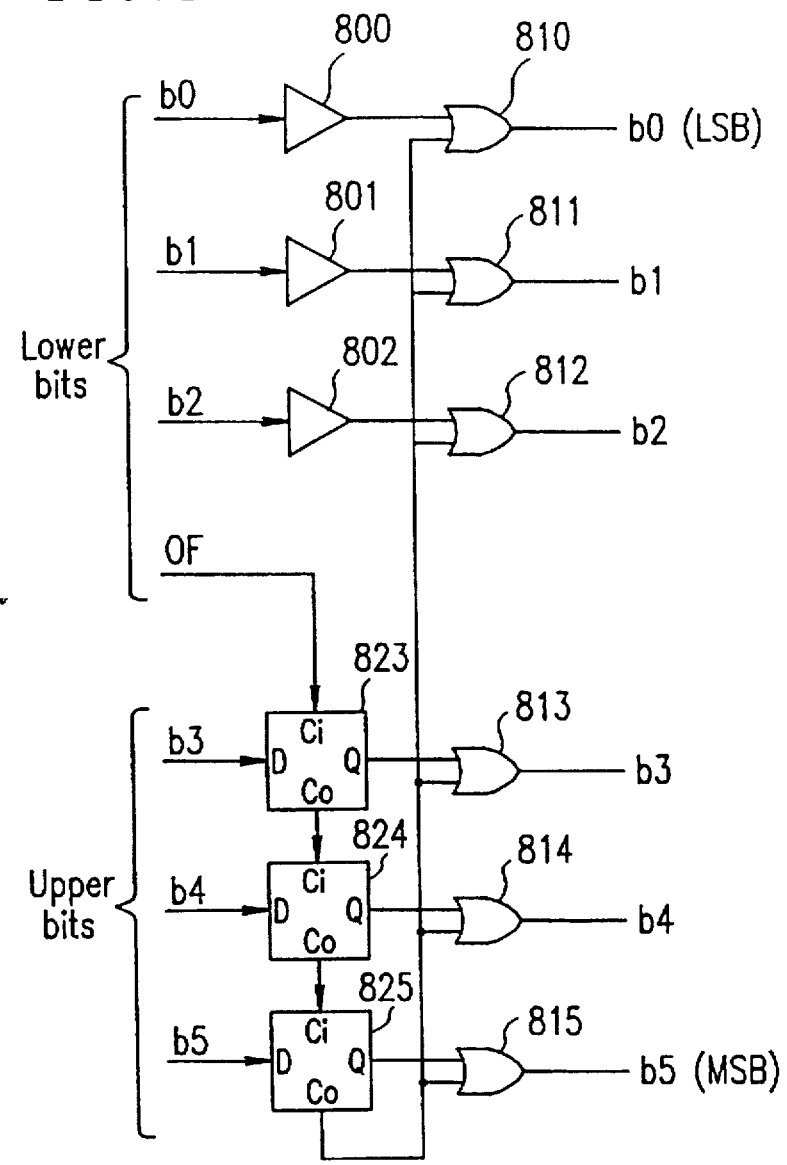
FIG. 8 is a circuit diagram showing a configuration for a synthetic logical circuit in the second example.
Figure 9:
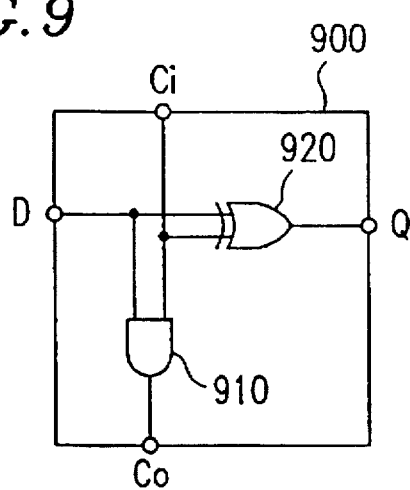
FIG. 9 is a circuit diagram showing a configuration for the half adder shown in FIG. 8.

FIG. 8 is a circuit diagram showing a configuration for a synthetic logical circuit in the second example. Buffers 800 to 802 receive b0 to b2 and OF shown in FIG. 7, respectively. Half adders 823 to 825 receive the upper bits b3 to b5. FIG. 9 is a circuit diagram showing a configuration for the half adder shown in FIG. 8. Each of the half adders 823 to 825 can be configured as the half adder 900. The half adder 900 has an AND gate 910 and an ExOR (exclusive-OR) gate 920. The gates 810 to 815 are OR gates and the outputs of the gates 810 to 815 finally represent the A/D converted bits b0 to b5.

Figure 10:
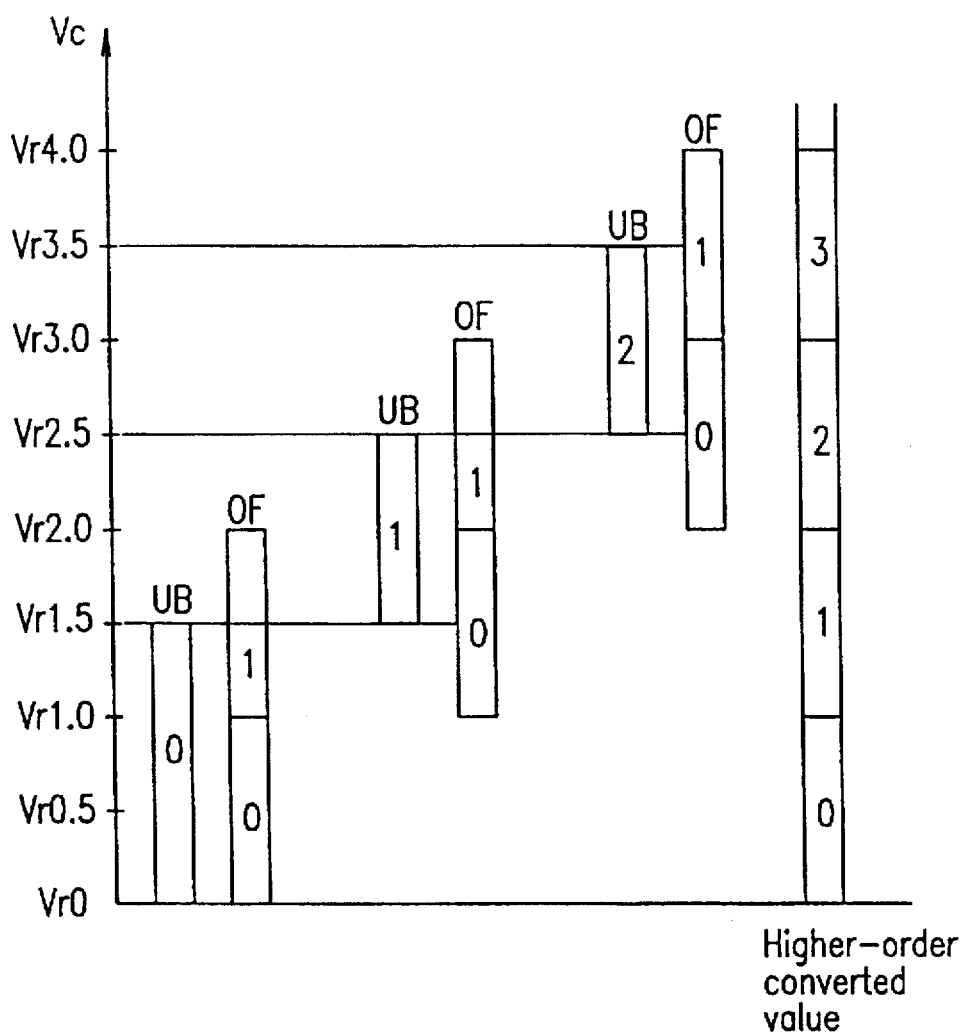
FIG. 10 is a diagram illustrating the second example.

FIG. 10 is a diagram illustrating the second example. In the second example, a higher-order converted value can be obtained from the upper bits UB and the lower-order overflow data OF. That is to say, when an inequality Vr1.5<Vc<Vr2.5 is satisfied, for example, the upper bits UB are equal to "001". In this case, if an inequality Vr1.5<Vc≦Vr2.0 is also satisfied, the overflow data OF is "0"; and if an inequality Vr2.0<Vc≦Vr2.5 is further satisfied, the overflow data OF is "1". Based on the finally obtained A/D converted values, a higher-order converted value is obtained by calculating a sum of the upper bits UB and the overflow data OF. Therefore, in this case, if Vr1.5<Vc≦Vr2.0, the higher-order converted value is "1", while if Vr2.0<Vc≦Vr2.5, the higher-order converted value is "2".

By utilizing the above-described configuration, a so-called overlap structure is realized in the second example. As a result, it is possible to prevent the offset voltage of the higher-order comparator array 540 and the settling characteristics of an input signal from affecting the final precision of the A/D conversion.

EXAMPLE 3

FIG. 11 is a circuit diagram showing a configuration for an interpolation type A/D converter in a third example of the present invention and corresponding to the circuit section including the reference voltage generator 110, the reference voltage selector 120, the higher-order comparator array 140 and the higher-order logical circuit 150 which are shown in FIG. 2. A reference voltage generator 1110 includes serially connected resistances 1111 to 1118. A reference voltage selector 1120 includes switches S0 to S8. Herein, as shown in FIG. 11, if at least one of the control terminals D1 and D2 of each of the switches S0 to S8 is at the "H" level, then the switch is turned ON, i.e., the terminals other than the control terminals close. The higher-order comparator array 1140 includes comparators 1141 to 1147. The higher-order logical circuit 1150 includes gates 1151 to 1157.

Figure 12:
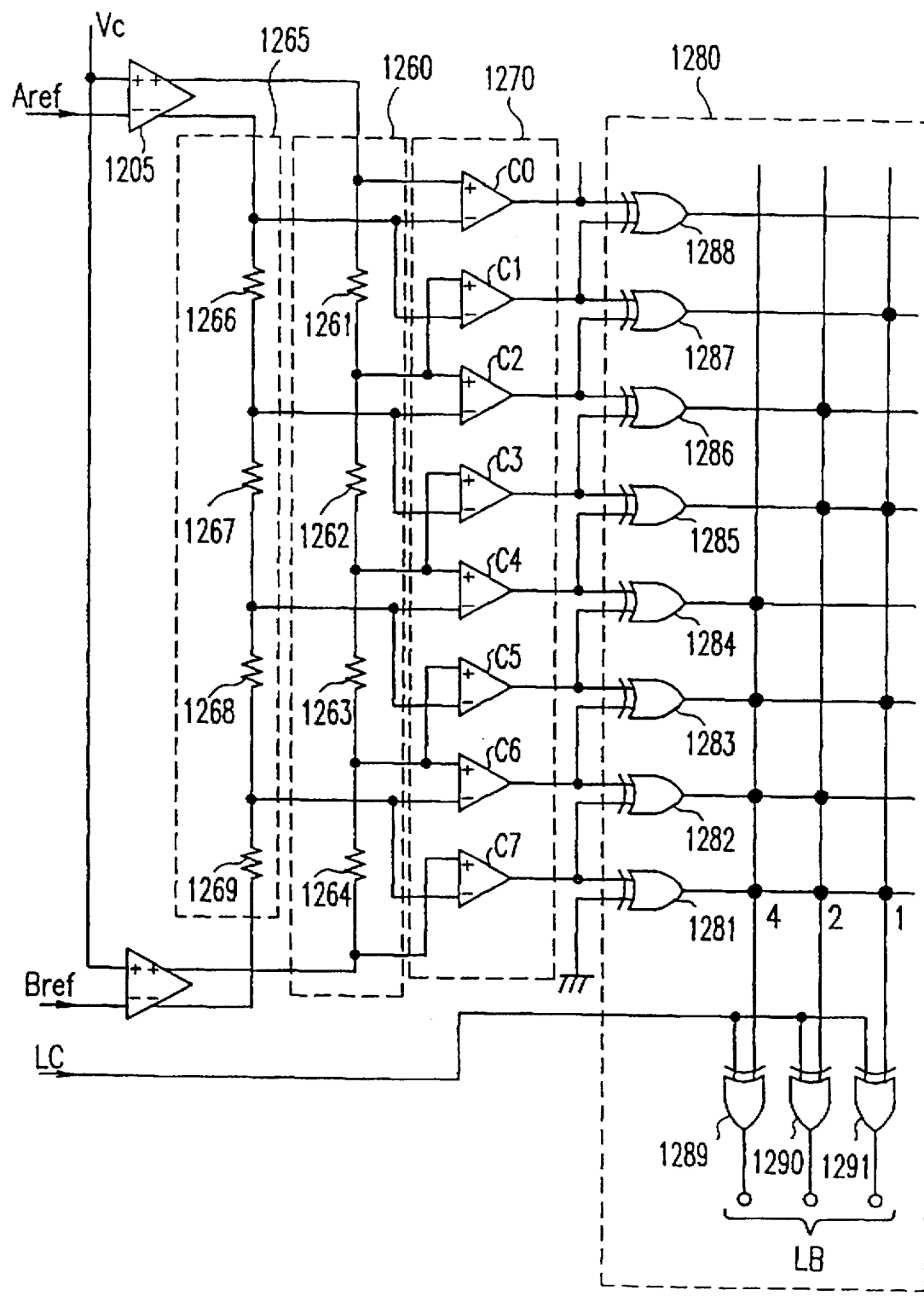
FIG. 12 is a circuit diagram showing a configuration for an interpolation type A/D) converter in the third example of the present invention and corresponding to the circuit section including the differential amplifiers 105 and 106, the voltage dividers 160 and 165, the lower-order comparator array 170 and the lower-order logical circuit 180 which are shown in FIG. 1.

FIG. 12 is a circuit diagram showing a configuration for an interpolation type A/D converter in the third example of the present invention and corresponding to the circuit section including the differential amplifiers 105 and 106, the voltage dividers 160 and 165, the lower-order comparator array 170 and the lower-order logical circuit 180 which are shown in FIG. 1. The voltage divider 1260 includes resistances 1261 to 1264 and the voltage divider 1265 includes resistances 1266 to 1269. The lower-order comparator array 1270 includes comparators C0 to C7. The lower-order logical circuit 1280 includes gates 1281 to 1291.

The reference voltage selector 120 of the first example outputs the higher reference voltage of the two selected reference voltages as a voltage VH to the differential amplifier 106 and outputs the lower reference voltage as a voltage VL to the differential amplifier 105. On the other hand, the reference voltage selector 1120 of the third example selectively outputs the reference voltages at the nodes Vr0, Vr2, Vr4, Vr6 and Vr8 among the selected reference voltages as voltages Aref to the differential amplifier 1205 and outputs the reference voltages at the nodes Vr1, Vr3, Vr5 and Vr7 as voltages Bref to the differential amplifier 1206.

FIG. 13 is a table showing a correspondence among the input voltage Vc, the comparators at the "H" level, the switches in an ON state and the values of the control signal LC for the lower-order logical circuit. For example, when an inequality Vr5<Vc<Vr6 is satisfied, the product obtained by multiplying together the outputs of a comparator "C5-/C6" is at the "H" level, so that the switches S5 and S6 are turned ON. Then, the reference voltage selector 1120 outputs the voltage Vr6 as Aref to the differential amplifier 1205 and the voltage Vr5 as Bref to the differential amplifier 1206. Assuming that the voltages input to the inverted input terminals of the differential amplifiers 1205 and 1206 are denoted by V1205 and V1206, respectively, V1206<Cr<V1205. This relationship is opposite to the relationship between the voltages input to the differential amplifiers in the first example. Therefore, the value output from the lower-order logical circuit 1280 also becomes the complement of 1. That is to say, in this case (or when Vr5<Vc<Vr6), it is natural that "101" should be output as the lower bits LB. However, only the output of the gate 1286 is at the "H" level. If it were not for the gates 1289 to 1291, the output would be "010". Therefore, it is necessary to invert this value. The gates 1289 to 1291 invert "010" by the value "1" of the control signal LC for the lower-order logical circuit, thereby finally outputting "101" as the lower bits LB.

Figure 14:
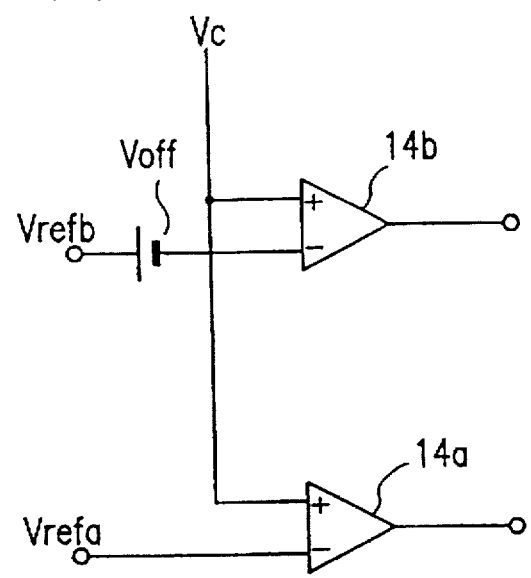
FIG. 14 is a circuit diagram showing a case where an offset voltage Voff is generated in one of the two differential amplifiers.

Hereinafter, a case where a remarkable effect can be attained by this third example will be described. FIG. 14 is a circuit diagram showing a case where an offset voltage Voff is generated in one of the two differential amplifiers. In FIG. 14, a voltage source Voff is equivalently connected between the inverted input terminal of the differential amplifier 14b of the two differential amplifiers 14a and 14b and the node Vrefb. On the other hand, there is no voltage source between the inverted input terminal of the differential amplifier 14a and the node Vrefa.

Figure 15:
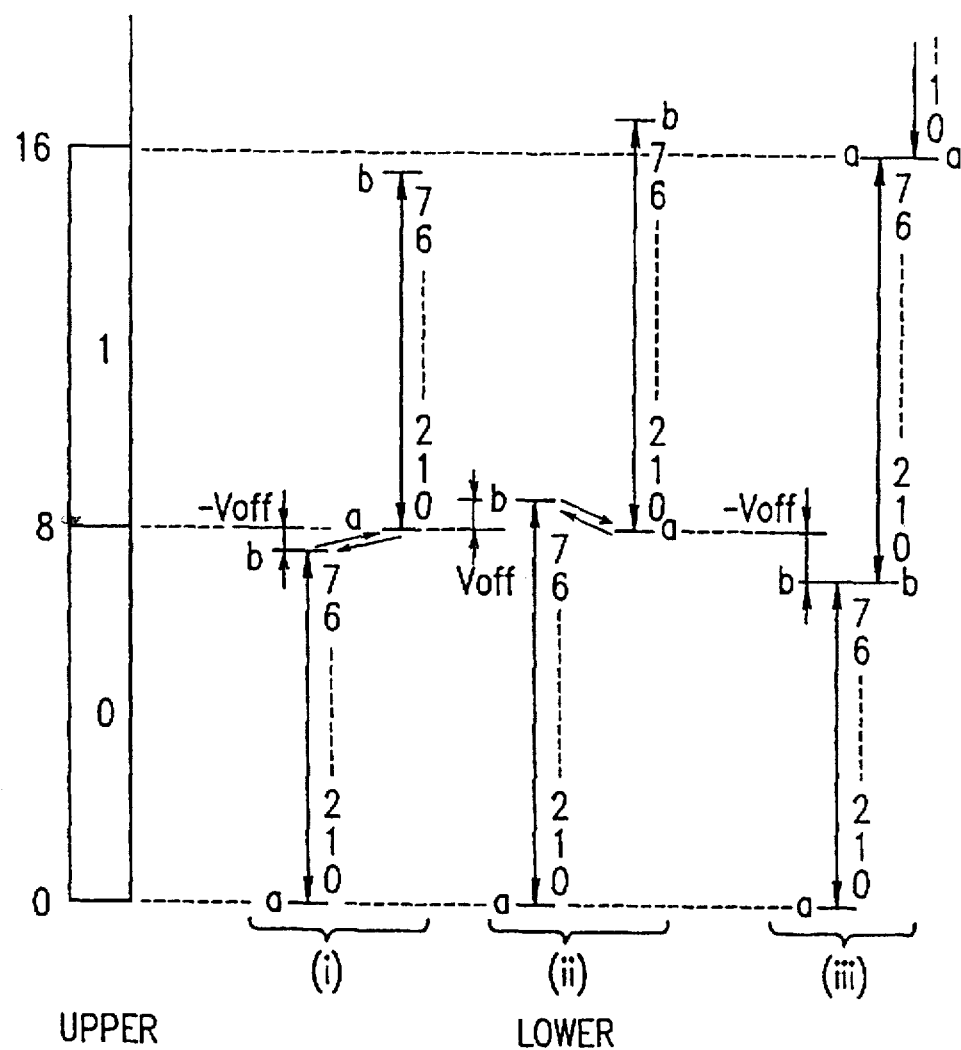
FIG. 15 is a diagram illustrating the effects of the offset voltage shown in FIG. 14 upon a conventional A/D converter and the A/D converter according to the present invention.

FIG. 15 is a diagram illustrating the effects of the offset voltage shown in FIG. 14 upon a conventional A/D converter and the A/D converter according to the present invention. In FIG. 15, "UPPER" indicates the values represented by the upper bits. For example, "0" of "UPPER" indicates the range where the upper 3 bits are represented as "000". On the other hand, "LOWER" in FIG. 15 indicates a voltage range in which "0" to "7" are represented by the lower 3 bits. (i) and (ii) of "LOWER" show the continuity of the reference voltages in a conventional A/D converter. In the case of "LOWER" (i) in a conventional A/D converter, the offset voltage Voff causes a gap between the voltages Vrefb and Vrefa. On the other hand, in the case of "LOWER" (ii) in a conventional A/D converter, the offset voltage Voff causes an overlap between the voltages Vrefb and Vrefa.

However, according to the present invention, as shown in "LOWER" (iii) in FIG. 15, the voltage range represented by the lower bits becomes continuous without causing any gap or any overlap. This is because the nodes connected to a differential amplifier are decided beforehand in this third example.

Figure 16:
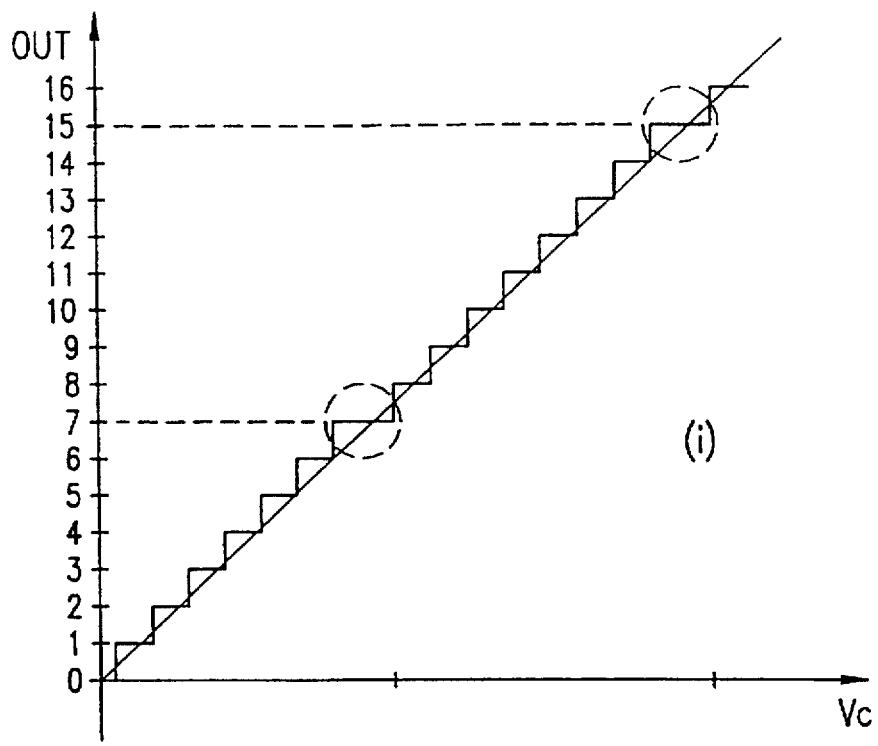
FIG. 16 is a graph showing a relationship between a voltage Vc and a converted output OUT In case (i) shown in FIG. 15.

FIG. 16 is a graph showing a relationship between a voltage Vc and a converted output OUT in the case of (i) shown in FIG. 15. In the case of (i) of FIG. 15, a gap exists in the range covered by the lower bits, so that the range of the voltage Vc becomes too wide when the value of the converted output OUT is (8n+7) (where n is an integer).

Figure 17:
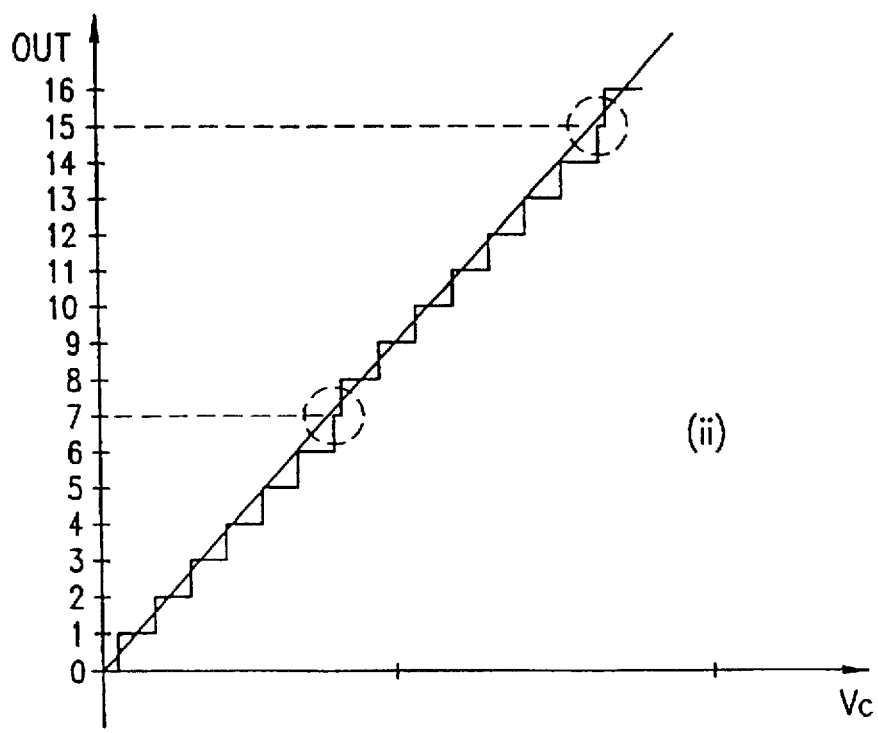
FIG. 17 is a graph showing a relationship between a voltage Vc and a converted output OUT in case (ii) shown in FIG. 15.

FIG. 17 is a graph showing a relationship between a voltage Vc and a converted output OUT in the case of (ii) shown in FIG. 15. In the case of (ii) of FIG. 15, an overlap exists in the range covered by the lower bits, so that the range of the voltage Vc becomes too narrow when the value of the converted output OUT is (8n+7) (where n is an integer).

Figure 18:
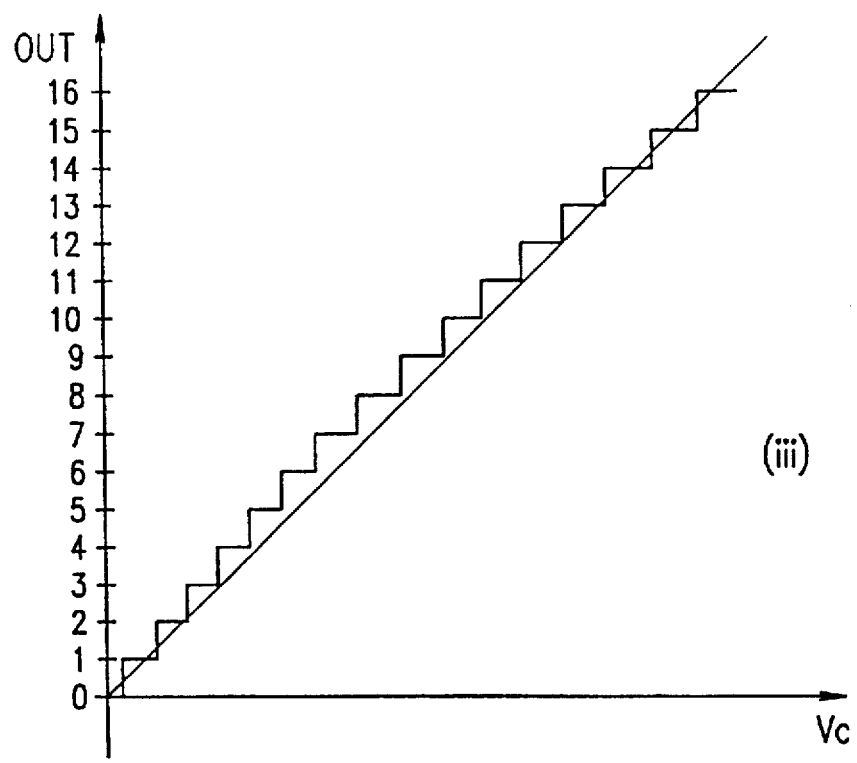
FIG. 18 is a graph showing a relationship between a voltage Vc and a converted output OUT in case (iii) shown in FIG. 15.

FIG. 18 is a graph showing a relationship between a voltage Vc and a converted output OUT in the case of (iii) shown in FIG. 15 or in the A/D converter according to the present invention. According to the present invention, as shown in (iii) of FIG. 15, neither a gap nor an overlap exists in the range covered by the lower bits, so that the range of the voltage Vc is not largely varied when the value of the converted output OUT is (8n+7) (where n is an integer). In other words, in the A/D converter in the third example of the present invention, though the integral non-linearity is unsatisfactory to a certain degree, the differential non-linearity becomes advantageously excellent.

EXAMPLE 4

Figure 19:
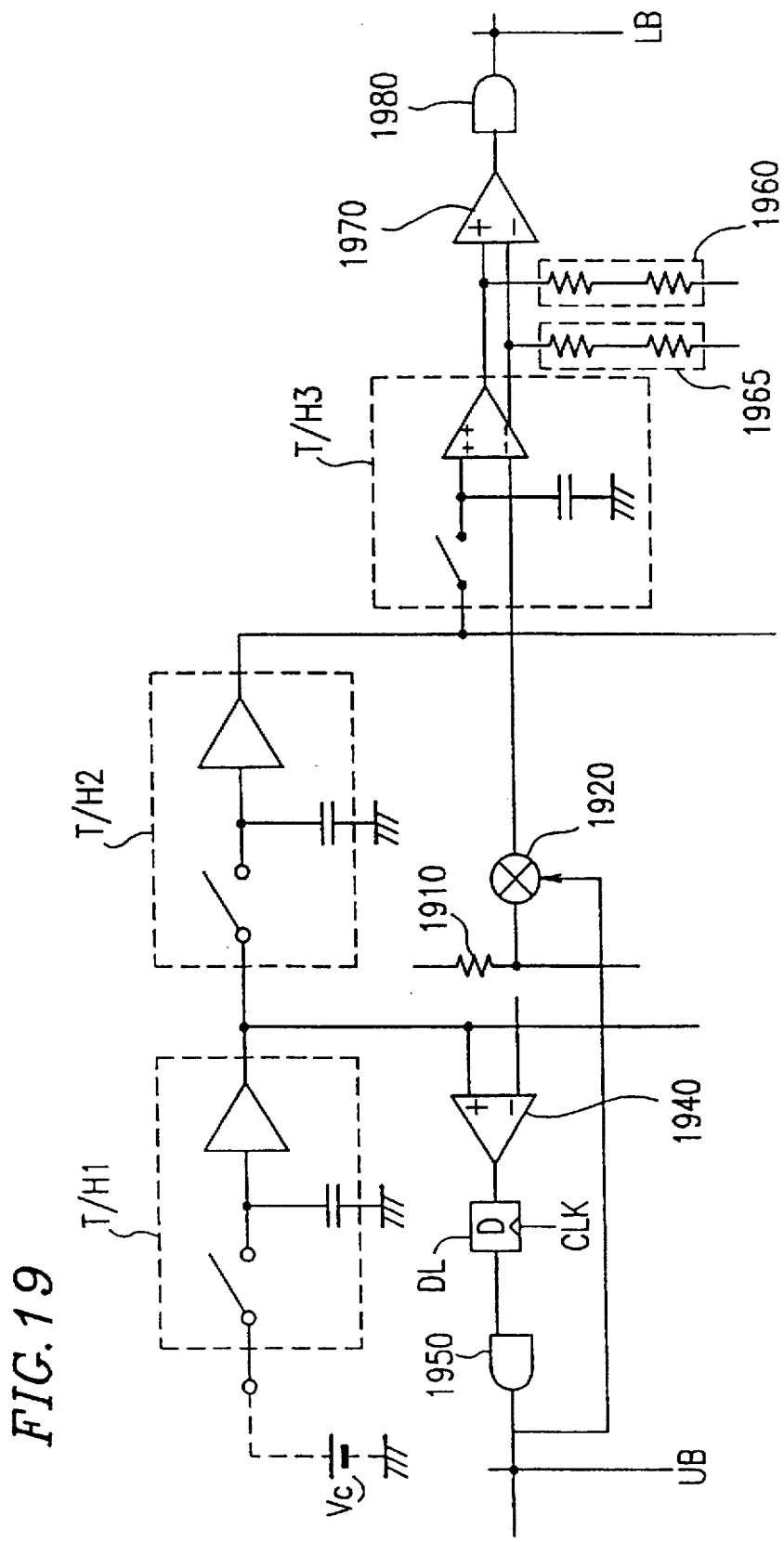
FIG. 19 is a circuit diagram showing which parts of the circuit of the first example are required to be modified for making the circuit of the first example perform a pipeline operation.

FIG. 19 is a circuit diagram showing which parts of the circuit of the first example are required to be modified for making the circuit of the first example perform a pipeline operation. Track and hold circuits T/H1, T/H2 and T/H3 and a D latch DL are required to be provided as additional components. The track and hold circuit T/H3 is a circuit obtained by adding a track and hold-function to the differential amplifier 105. A circuit corresponding to the differential amplifier 106 is not shown in FIG. 19. In addition, a resistance 1910 corresponds to the reference voltage generator 110; a switch 1920 corresponds to the reference voltage selector 120; a comparator 1940 corresponds to the higher-order comparator array 140; a gate 1950 corresponds to the higher-order logical circuit 150; voltage dividers 1960 and 1965 correspond to the voltage dividers 160 and 165, respectively; a comparator 1970 corresponds to the lower-order comparator array 170; and a gate 1980 corresponds to the lower-order logical circuit 180.

Figure 20:
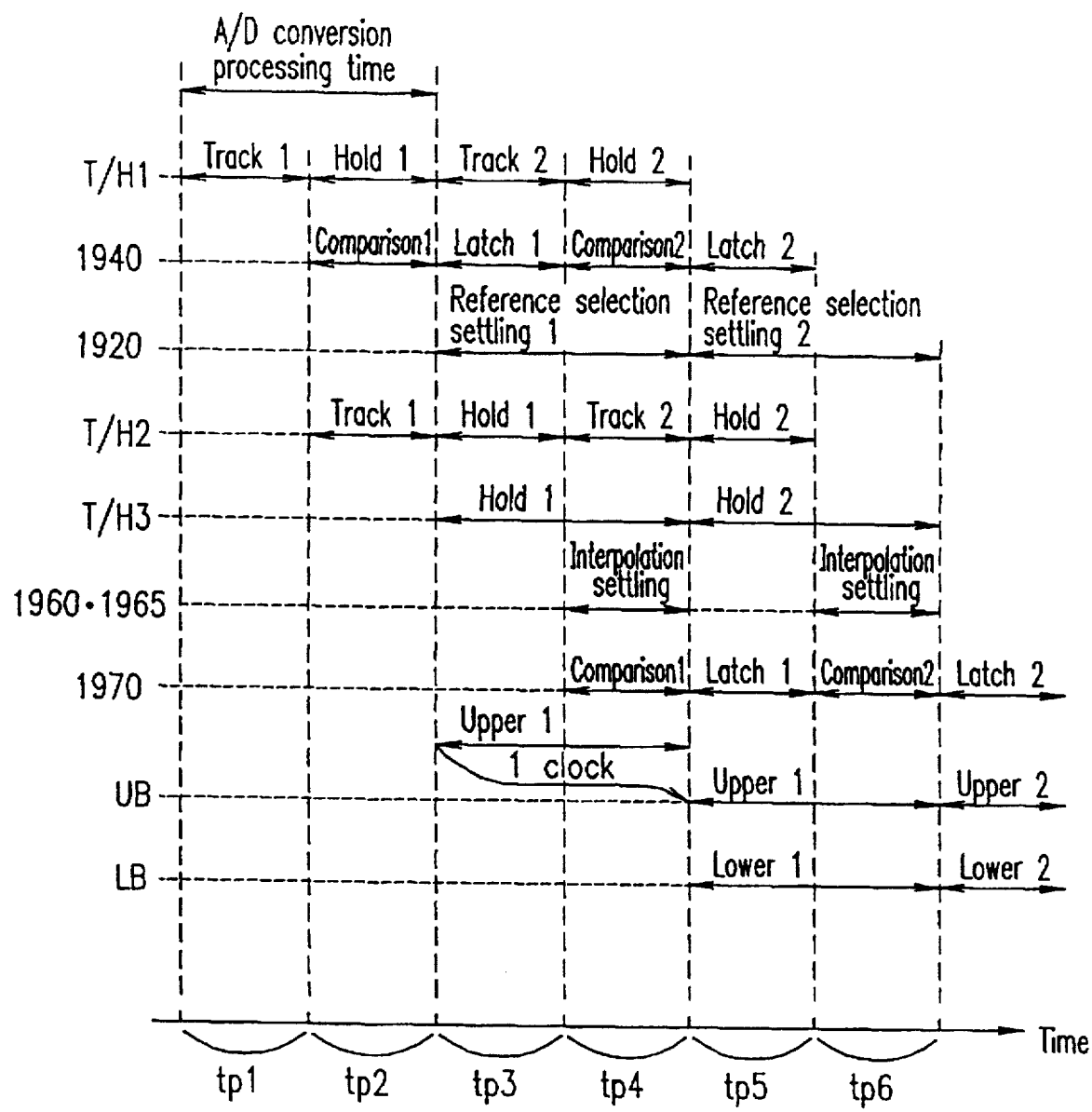
FIG. 20 is a timing chart used in the pipeline operation in the fourth example.

FIG. 20 is a timing chart used in the pipeline operation in the fourth example. In this timing chart, the numeral, attached at the end of a label indicating the operation, corresponds to one A/D conversion cycle and is assigned for identifying the voltage Vc to be processed.

Each of the periods tp1 to tp6 is equal to one half cycle of a clock applied to the D latch DL, and is also equal to a track period or a hold period of the track and hold circuits T/H1 and T/H2.

In the period tp1, the track and hold circuit T/H1 is in a track mode and, tracks the input voltage Vc.

In the period tp2, the track and hold circuit T/H1 is in a hold mode and holds the voltage Vc. When the period tp2 starts and the input to the comparator 1940 is settled, the comparator 1940 performs a comparison during the period tp2. On the other hand, the output of the track and hold circuit T/H1 is input to the track and hold circuit T/H2. The track and hold circuit T/H2 tracks the output of the track and hold circuit T/H1 during the period tp2.

In the period tp3, the track and hold circuit T/H1 newly tracks the voltage Vc. Since this newly tracked voltage is different from the voltage which has been tracked and held during the periods tp1 and tp2 (corresponding to Track "1" and Hold "1"), this voltage is represented as Track "2" and Hold "2" in FIG. 20. In the period tp3, the output of the comparator 1940 is latched by the D latch DL. Also, in this period, the switch 1920 selects a reference voltage in accordance with the latched output of the comparator 1940. It takes the periods tp3 and tp4 to settle this selection. In the period tp3, the track and hold circuit T/H2 is in a hold state, while the track and hold circuit T/H3 holds this held value during the periods tp3 and tp4.

In the period tp4, an interpolation is performed by the voltage dividers 1960 and 1965 and a comparison is performed by the comparator 1970.

In the periods tp5 and tp6, the lower bits LB are output in accordance with the output of the comparator 1970. In this case, the upper bits UB can be output in the periods tp3 and tp4. Therefore, if the value of the upper bits UB is delayed, for example, in the synthetic logical circuit 107 by the periods tp3 and tp4 for obtaining a finally converted value from the upper bits UB and the lower bits LB, the timing at which the upper bits Us are output agrees with the timing at which the lower bits LB are output.

If the above-described pipeline operation is performed, the time required for the A/D conversion finally becomes equal to one cycle of a clock of the D latch DL (or the sum of a track period and a hold period of the track and hold circuit T/H1). If the pipeline operation is not used, one cycle of the A/D conversion requires the periods tp1 to tp6. However, in this fourth example, one cycle of the A/D conversion can be shortened to one-third as compared with the case where the pipeline operation is not performed. In other words, the clock frequency for the A/D conversion can be three times as high as an ordinary clock frequency.

EXAMPLE 5

Figure 21:
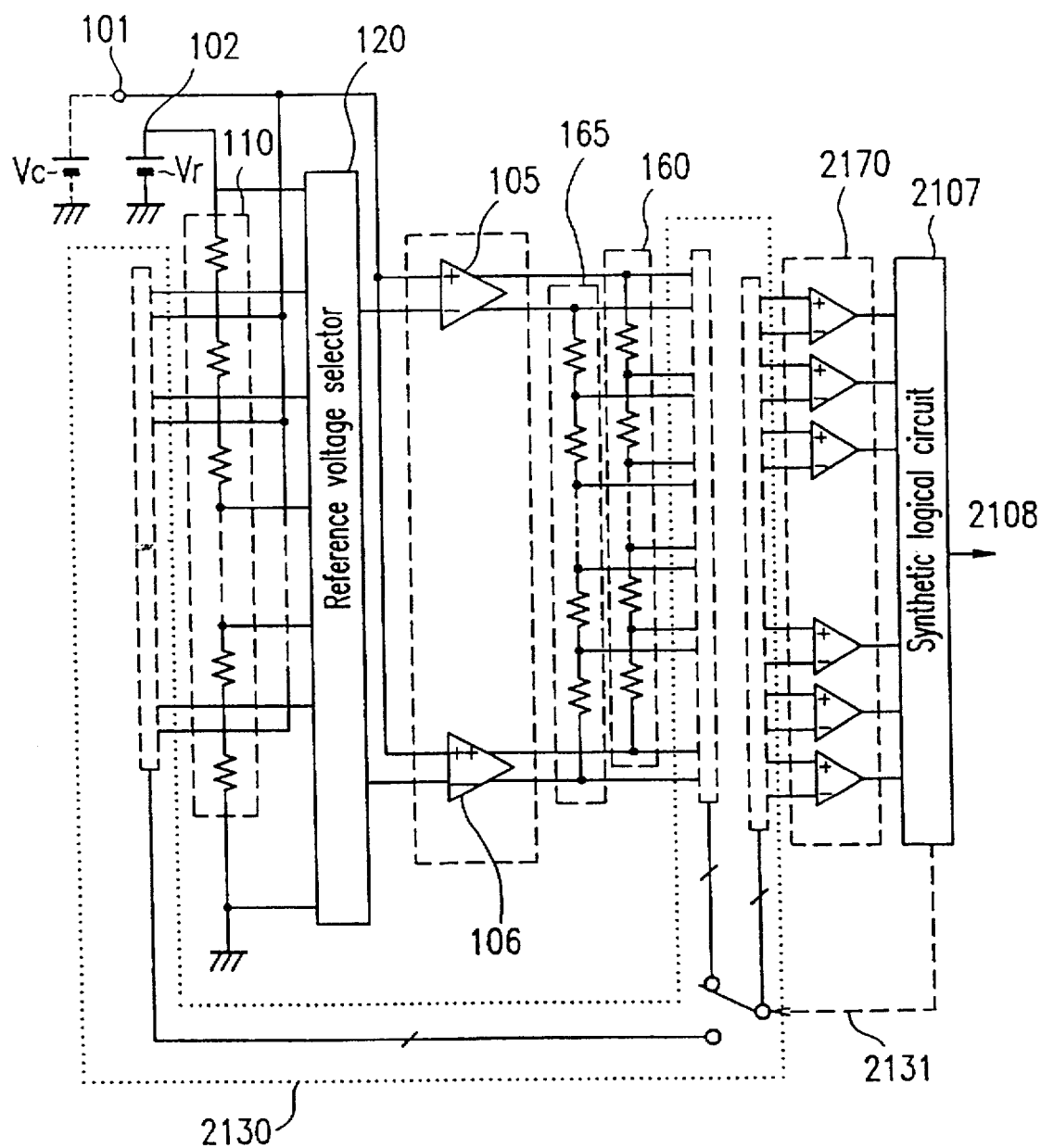
FIG. 21 is a circuit diagram showing a configuration for an interpolation type A/D converter in a fifth example of the present invention.

FIG. 21 is a circuit diagram showing a configuration for an interpolation type A/D converter in a fifth example of the present invention. In this fifth example, the higher-order comparator array 140 and the lower-order comparator array 170 in the first example of the present invention are integrated into a comparator array 2170 which can be used in common as both the comparator arrays 140 and 170. A switch 2130 selects the voltage to be input to the comparator array 2170 in accordance with a control signal 2131 output from the synthetic logical circuit 2107.

When the upper bits are A/D converted, a voltage Vc is applied to one terminal of each of the comparators included in the comparator array 2170, while a corresponding one of a plurality of reference voltages generated by the reference voltage generator 110 is applied to the other terminal of each comparator. When the lower bits are A/D converted, voltages divided by the voltage dividers 160 and 165 are supplied to the input terminals of each of the comparators included in the comparator array 2170.

The synthetic logical circuit 2107 latches and synthesizes the upper and the lower bits obtained by the A/D conversion, thereby outputting the synthesized bits as an A/D converted output 2108.

As described above, by using a comparator array in common, the power consumption and the area occupied by the A/D converter on the chip can be further reduced.

EXAMPLE 6

Figure 22:
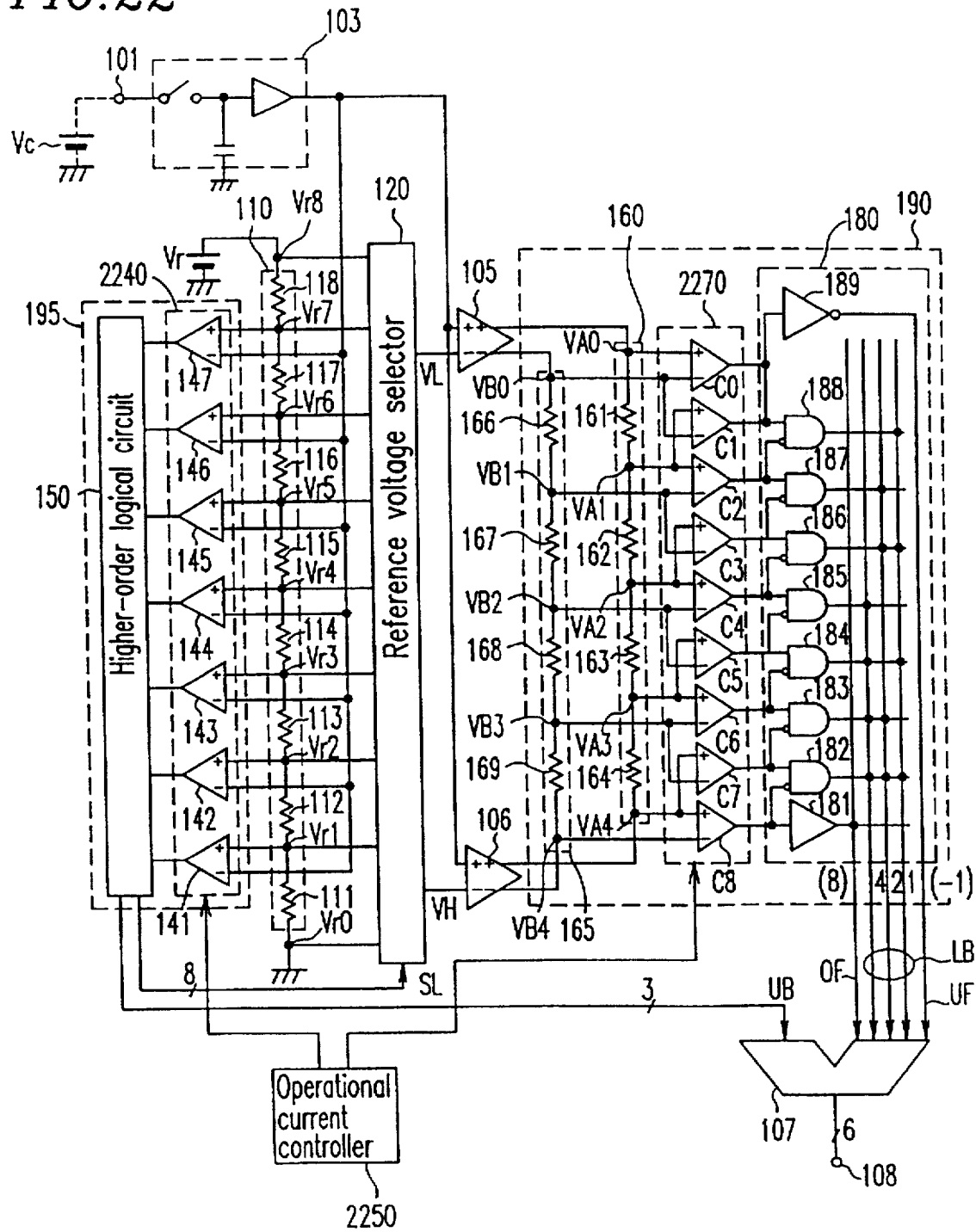
FIG. 22 is a circuit diagram showing a configuration for an interpolation type A/D converter in a sixth example of the present invention.
Figure 23:
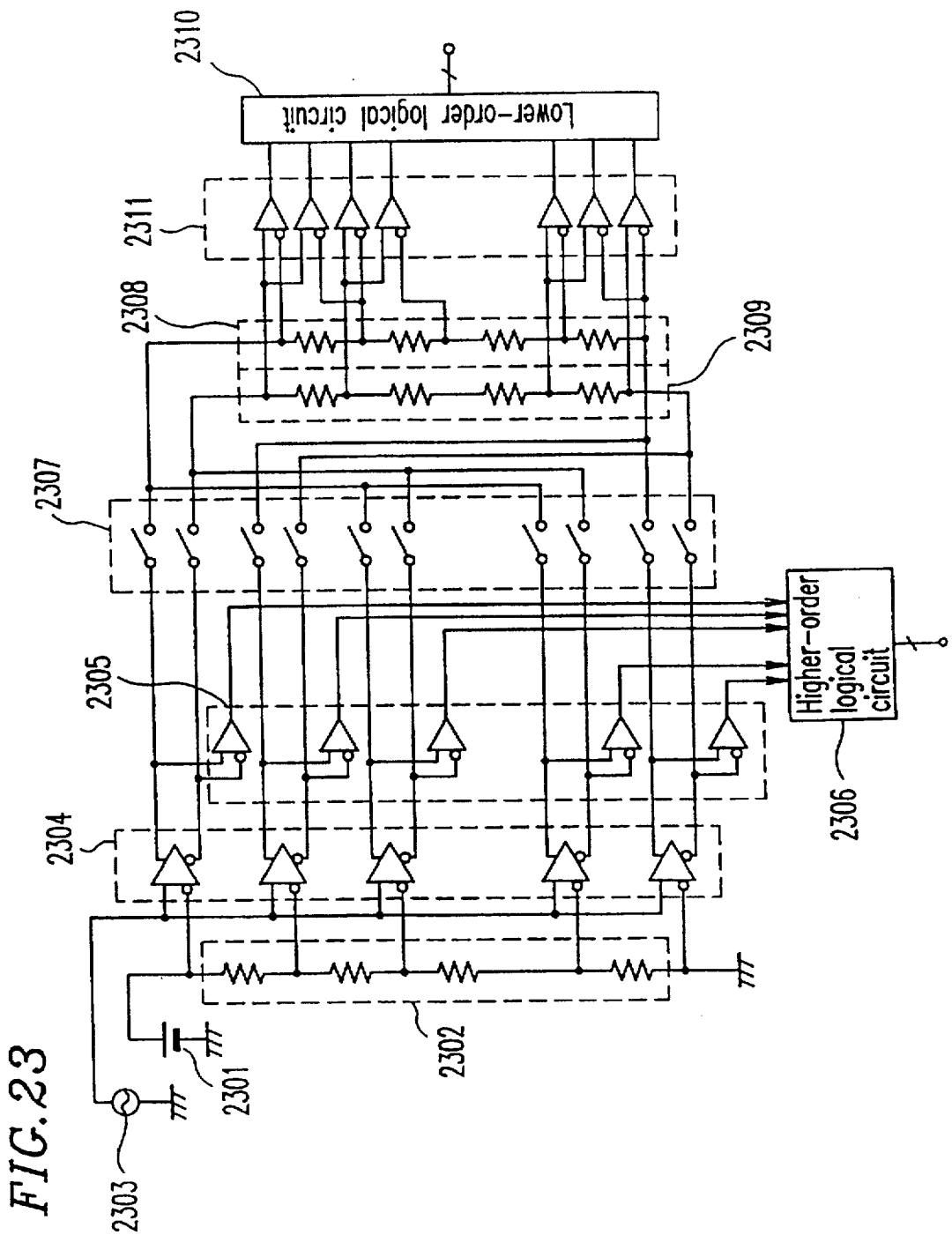
FIG. 23 is a circuit diagram showing a configuration for a conventional serial-parallel type A/D converter.

FIG. 22 is a circuit diagram showing a configuration for an interpolation type A/D converter in a sixth example of the present invention. In this sixth example, a controller is provided for controlling the current consumed by the higher-order comparator array 140 and the lower-order comparator array 170 of the first example of the present invention. More specifically, each of a higher-order comparator array 2240 and a lower-order comparator array 2270 receives a control signal from an operational current controller 2250. In accordance with this control signal, the higher-order comparator array 2240 and the lower-order comparator array 2270 reduce the power consumption by such a method as a control of a bias current thereof. That is to say, when the upper bits are A/D converted, the current flowing through the higher-order comparator array 2240 is held at a nominal value, while the current flowing through the lower-order comparator array 2270 is controlled or cut off. On the other hand, when the lower bits are A/D converted, the current flowing through the higher-order comparator array 2240 is controlled or cut off, while the current flowing through the lower-order comparator array 2270 is held at a nominal value. As described above, in this sixth example, the consumed current can be advantageously reduced.

EXAMPLE 7

Figure 24:
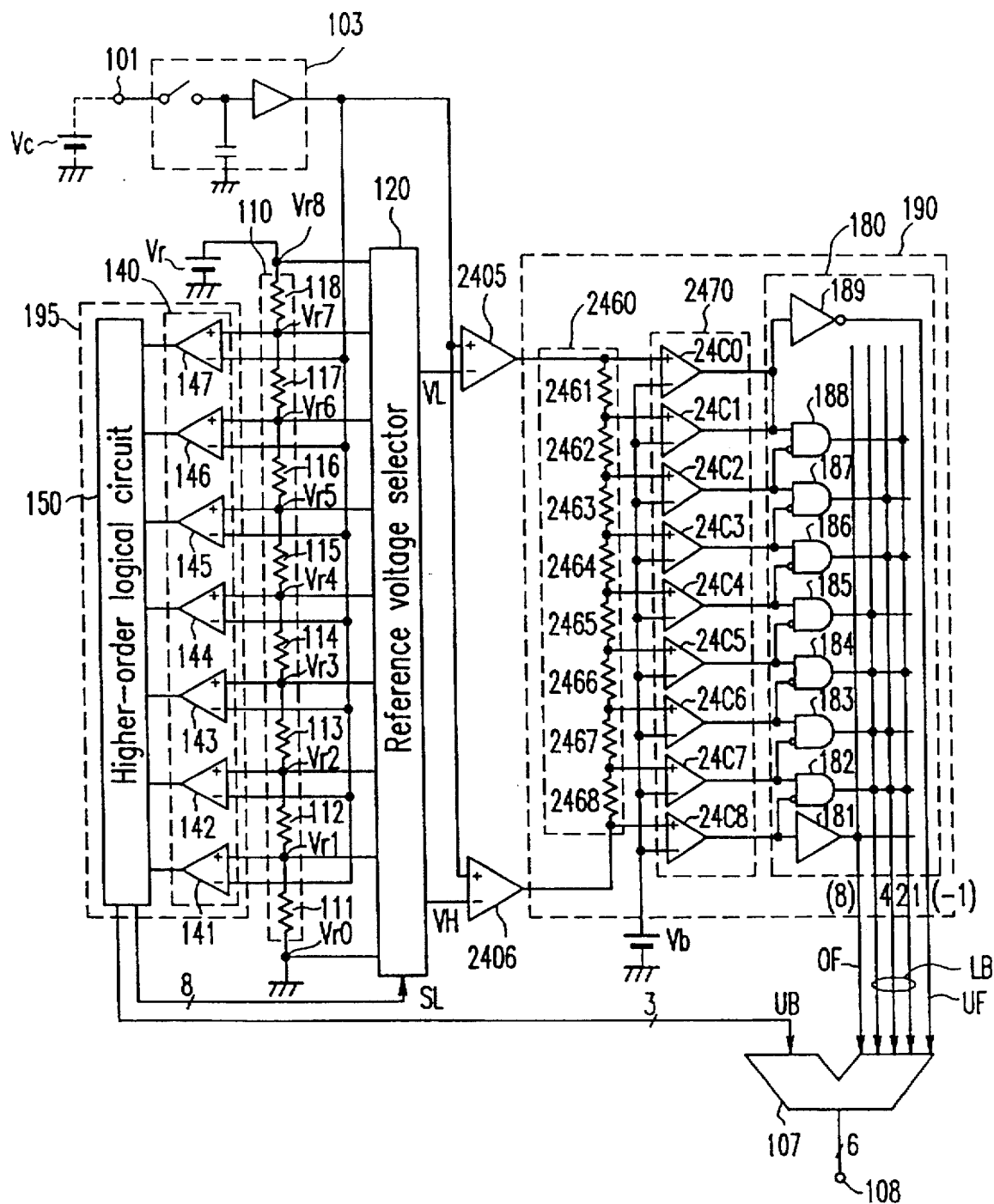
FIG. 24 is a circuit diagram showing a configuration for an interpolation type A/D converter in a seventh example of the present invention.

FIG. 24 is a circuit diagram showing a configuration for an interpolation type A/D converter in a seventh example of the present invention. In this seventh example, amplifiers 2405 and 2406 are used in place of the differential amplifiers 105 and 106, a voltage divider 2460 is used in place of the voltage dividers 160 and 165 and a lower-order comparator array 2470 is used in place of the lower-order comparator array 1170.

Each of the amplifiers 2405 and 2406 has a single output terminal.

The voltage divider 2460 consists of serially connected resistances 2461 to 2468, thereby dividing the output voltages of the amplifiers 2405 and 2406. The lower-order comparator array 2470 consists of comparators 24C0 to 24C8. The non-inverted input terminal of each of the comparators 24C0 to 24C8 is connected to the node of the corresponding resistance of the voltage divider 2460. On the other hand, the inverted input terminal of each of the comparators 24C0 to 24C8 is connected to a voltage source Vb for generating a constant voltage Vb. Assuming that, when an equal voltage is applied to the non-inverted input terminal and the Inverted input terminal of a differential amplifier 105 (or a differential amplifier 106) of the first example, the voltage output through the non-inverted output terminal and the inverted output terminal of a differential amplifier 105 (or a differential amplifier 106) is called a "bias voltage", the voltage Vb is set equal to the bias voltage.

In the seventh example, by utilizing the above-described configuration, the same effects as those attained by the first example can also be attained under a simplified configuration in which an amplifier has a single output terminal.

In the seventh example, the voltage source Vb becomes unnecessary when the bias voltage is 0 V. In such a case, the inverted input terminal of each of the comparators 24C0 to 24C8 may be connected to the ground.

The interpolation type A/D converter according to the present invention can attain at least the following effects:

(1) It is no longer necessary to adjust a full scale voltage, unlike a conventional A/D converter, so that a high-precision conversion can be performed.

(2) Since the amplification factor of a differential amplifier does not directly affect the precision of the A/D conversions a high-precision conversion is realized. In addition, since the settling time in a differential amplifier is not required to be long, an A/D conversion can be performed at a higher rate.

(3) Since the amplification action of a differential amplifier can reduce the voltage offset in the lower-order comparators to the inverse number of the amplification factor, a high-precision conversion is realized.

According to the present invention, it is possible to provide an A/D converter which can perform a high-precision A/D conversion without using adjustment circuits; can perform a high-rate A/D conversion since high-precision operational amplifiers are not required to be used; and has a reduced chip area and can perform such a high-precision and high-rate A/D conversion at lower power consumption and with lower costs.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An A/D converter for receiving an input voltage and outputting a digital signal representing a level of the input voltage by a number n (where n is a natural number equal to or larger than 2) of upper bits and a number m (where m is a natural number equal to or larger than 2) of lower bits, comprising:

reference voltage generation means for generating a plurality of reference voltages;

upper bit generation means for generating the upper bits by comparing the input voltage with the plurality of reference voltages;

selection means for selecting a first voltage equal to or higher than the input voltage and a second voltage equal to or lower than the input voltage from the plurality of reference voltages;

first differential amplification means for amplifying a difference between the first voltage and the input voltage and outputting an amplified voltage;

second differential amplification means for amplifying a difference between the second voltage and the input voltage and outputting an amplified voltage;

lower bit generation means for generating the lower bits by using the output voltage of the first differential amplification means and the output voltage of the second differential amplification means; and synthesis means for generating the digital signal by synthesizing the upper bits with the lower bits.

2. An A/D converter according to claim 1, wherein the lower bit generation means comprises: voltage division means for outputting a plurality of divided voltages by dividing the output voltage of the first differential amplification means and the output voltage of the second differential amplification means; and a plurality of comparison means for comparing the plurality of divided voltages with a constant voltage.

3. An A/D converter according to claim 1, wherein each of the first and the second differential amplification means outputs the amplified positive voltage as a non-inverted output and the amplified negative voltage as an inverted output, and wherein the lower bit generation means comprises:

first voltage division means for outputting a plurality of divided voltages by dividing the voltage output as the non-inverted output by the first differential amplification means and the voltage output as the non-inverted output by the second differential amplification means;

second voltage division means for outputting a plurality of divided voltages by dividing the voltage output as the inverted output by the first differential amplification means and the voltage output as the inverted output by the second differential amplification means; and comparison means for comparing the voltages output from the first voltage division means with the voltages output from the second voltage division means.

4. An A/D converter according to claim 3, wherein the first voltage division means divides a voltage VA0 output as the non-inverted output by the first differential amplification means and a voltage VAk output as the non-inverted output by the second differential amplification means, thereby outputting voltages VA0, VA1, VA2, . . . VAi, . . . and VAk (where k is a natural number equal to or larger than 2; i is a natural number in a range from 1 to k; and VA0<VA1<VA2< . . . <VAi< . . . <VAk);

and wherein the second voltage division means divides a voltage VB0 output as the inverted output by the first differential amplification means and a voltage VBk output as the inverted output by the second differential amplification means, thereby outputting voltages VB0, VB1, VB2, . . . VBi, . . . and Vok (where VB0<VB1<VB2< . . . <VBi< . . . <VBk);

and wherein the comparison means compares the voltages VAi and VBi (where i is a natural number equal to or smaller than k) with each other and compares the voltage VAi with a voltage VBi−1.

5. An A/D converter according to claim 3, wherein the reference voltage generation means generates a number k (where k is a natural number equal to or smaller than 2) of voltages V1, V2, . . . Vi, . . . and Vk (where i is a natural number in a range from 1 to k; and V1<V2< . . . <Vi< . . . <Vk);

and wherein, when the input voltage is in a range from a voltage $V_{i-1}$ to a voltage $V_{i+1}$, the selection means selects a voltage $V_{i+2}$ as the first voltage and selects a voltage $V_{i-2}$ as the second voltage.

6. An A/D converter according to claim 5, wherein, when the input voltage is in a range from a voltage $V_{i-1}$ to a voltage $V_{i+1}$, the lower bit generation means performs an A/D conversion in a range from $V_{i-2}$ or the second voltage to $V_{i+2}$ or the first voltage by using (m+1) bits and outputs lower-order overflow data representing whether the input voltage exists in a range from the voltage $V_{i-2}$ and to the voltage $V_i$ or in a range from the voltage $V_i$ to the voltage $V_{i+2}$, and wherein the synthesis means adds the lower-order overflow data to a least significant bit of the upper bits.

7. An A/D converter according to claim 1, wherein the reference voltage generation means outputs voltages $VR_0$, $VR_1$, $VR_2$, ... $VR_i$, ... and $VR_k$ (where k is a natural number equal to or larger than 2; i is a natural number in a range from 1 to k; and $VR_0 < VR_1 < VR_2 < ... < VR_i < ... < VR_k$), and wherein the selection means selects the reference voltage depending upon whether the natural number i is an odd number or an even number.

8. An A/D converter according to claim 1, further comprising: track and hold means for holding the input voltage; track and hold means for holding the upper bits; and track and hold means for holding the first and the second voltages, thereby performing an A/D conversion by a pipeline operation.

* * * * *